United States Patent
Krapf et al.

(10) Patent No.: US 11,143,725 B2
(45) Date of Patent: Oct. 12, 2021

(54) SENSOR FOR A NUCLEAR MAGNETIC RESONANCE DEVICE

(71) Applicant: Robert Bosch GmbH, Stuttgart (DE)

(72) Inventors: Reiner Krapf, Filderstadt (DE); Ulli Hoffmann, Niefern-Oeschelbronn (DE); Michael Distler, Güntersleben (DE); Stefan Wintzheimer, Retzstadt (DE); Toni Driesle, Kaufbeuren (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/652,832

(22) PCT Filed: Sep. 26, 2018

(86) PCT No.: PCT/EP2018/076125
§ 371 (c)(1),
(2) Date: Apr. 1, 2020

(87) PCT Pub. No.: WO2019/072567
PCT Pub. Date: Apr. 18, 2019

(65) Prior Publication Data
US 2020/0319277 A1  Oct. 8, 2020

(30) Foreign Application Priority Data
Oct. 9, 2017 (DE) ...................... 10 2017 217 875.2

(51) Int. Cl.
*G01R 33/383* (2006.01)
*G01R 33/34* (2006.01)
*G01R 33/38* (2006.01)

(52) U.S. Cl.
CPC ........... *G01R 33/383* (2013.01); *G01R 33/34* (2013.01); *G01R 33/3808* (2013.01)

(58) Field of Classification Search
CPC ... G01R 33/383; G01R 33/34; G01R 33/3808
See application file for complete search history.

(56) References Cited

U.S. PATENT DOCUMENTS

2010/0244828 A1  9/2010  Pines et al.
2012/0049849 A1*  3/2012  Balcom .............. G01R 33/3808
                                              324/322

(Continued)

FOREIGN PATENT DOCUMENTS

DE  20 2006 002 074 U1  7/2006
DE  10 2014 218 375 A1  3/2016
WO     2006061618 A1  6/2006

OTHER PUBLICATIONS

International Search Report corresponding to PCT Application No. PCT/EP2018/076125, dated Jan. 7, 2019 (German and English language document) (6 pages).

*Primary Examiner* — G. M. A Hyder
(74) *Attorney, Agent, or Firm* — Maginot, Moore & Beck LLC

(57) ABSTRACT

A sensor for a nuclear magnetic resonance device includes a magnetic field generation apparatus with a planar magnet arrangement for generating a static magnetic field in a useful volume. The planar magnet arrangement has a plurality of magnetic poles on a front side facing the useful volume, which are arranged adjacent to each other along an extension direction of the planar magnet arrangement with alternating orientation, and a measuring apparatus for measuring a signal based on nuclear magnetic resonance of a material sample arranged in the useful volume. The measuring apparatus includes an electrical coil having a winding for generating an alternating magnetic field in the useful volume, the winding arranged between two directly adjacent magnetic poles of the planar magnet arrangement such that the alternating magnetic field of the electrical coil is superposed with the static magnetic field of the planar magnet arrangement orthogonally in the entire useful volume.

21 Claims, 16 Drawing Sheets

(56) References Cited

U.S. PATENT DOCUMENTS

2017/0176549 A1* 6/2017 Krapf .................... G01R 33/448
2018/0306879 A1* 10/2018 Bashyam ............. G01R 33/383

\* cited by examiner

SENSOR FOR A NUCLEAR MAGNETIC RESONANCE DEVICE

This application is a 35 U.S.C. § 371 National Stage Application of PCT/EP2018/076125, filed on Sep. 26, 2018, which claims the benefit of priority to Serial No. DE 10 2017 217 875.2, filed on Oct. 9, 2017 in Germany, the disclosures of which are incorporated herein by reference in their entirety.

The disclosure relates to a sensor for a nuclear magnetic resonance device having a magnetic field generation apparatus comprising a planar magnet arrangement and a measuring apparatus. The disclosure further comprises a nuclear magnetic resonance device having at least one such sensor.

BACKGROUND

Magnetic resonance or nuclear magnetic resonance (NMR) is employed in various technical applications for the measurement of material properties. The measuring principle is based here on a physical effect, in which the material sample to be investigated is exposed to external magnetic fields, and the variation in the magnetization of the atomic nuclei within the material sample, in response to the external magnetic fields, is measured. In particular, the atomic nuclei in the material sample are initially oriented by means of a first magnetic field (B0 field). In this arrangement, the nuclear spins of the atomic nuclei are in resonance with the first magnetic field, wherein the spins of the atomic nuclei about the magnetic field lines are predicated at the so-called Larmor frequency (Larmor precession). If the material sample is then exposed to a second magnetic field (B1 field), which is oriented orthogonally to the first magnetic field, the atomic nuclei in the first nuclear spin state can vary the orientation of their spin by the absorption of energy from the second magnetic field. If the second magnetic field is deactivated once more, wherein the material sample continues to be exposed to the first magnetic field, the atomic nuclei, the nuclear spins of which have previously been deflected, assume an excited nuclear spin state from which, in a relaxation process, they revert once more to the lower-energy first nuclear spin state, in which their nuclear spins are oriented with the magnetic field lines of the first magnetic field. The relaxation process involves the emission of electromagnetic radiation, which is perceptible as a variation in the magnetic field. This variation in the magnetic field can be detected as a response signal by means of an appropriate detection or measuring apparatus in the form of an antenna or a coil. Given an appropriate selection of the operating parameters for the nuclear magnetic resonance device, by the evaluation of the amplitude and the temporal characteristic of the response signal, it is possible to infer the relaxation times of the nuclear spins, and thus the quantity or concentration of specific atoms in the material sample. As hydrogen atoms in particular can be detected by means of nuclear magnetic resonance, this measuring method is optimally appropriate for the determination of the quantity or distribution of water in the material sample.

In particular, as a first magnetic field, a static magnetic field having defined properties and, as a second magnetic field, an alternating electromagnetic field, such as, for example a pulsed magnetic field, are in this case employed.

In order to achieve an optimum nuclear magnetic resonance measurement, particularly precise and uniform magnetic fields are required in the volume to be measured or in the layer to be measured. In particular, the orthogonality of the magnetic fields in the useful volume must also be ensured. For this reason, nuclear magnetic resonance devices are typically configured in the form of a closed cylinder. This design restricts the application of the nuclear magnetic resonance device, as only such material samples can be measured which are admitted to the interior of the cylinder.

SUMMARY

The object of the disclosure is therefore to provide an option for the measurement of larger or planar material samples by means of nuclear magnetic resonance. This object is achieved by a sensor as disclosed herein.

According to the disclosure, a sensor is provided for a nuclear magnetic resonance device for determining at least one material property of a material sample arranged in a useful volume. The nuclear magnetic resonance device comprises herein a magnetic field generation apparatus having a planar magnet arrangement for generating a static magnetic field in the useful volume, wherein the planar magnet arrangement has a plurality of magnetic poles on a front side, facing the useful volume, which magnetic poles are arranged adjacently to each other along a first extension direction of the planar magnet arrangement with a respectively alternating orientation. The nuclear magnetic resonance device further comprises a measuring apparatus for measuring a response signal based on the nuclear magnetic resonance of the material sample arranged in the useful volume, comprising an electrical coil having at least one winding for generating an alternating magnetic field in the useful volume. The winding is arranged in this case between two directly adjacent magnetic poles of the planar magnet arrangement, such that the alternating magnetic field of the electrical coil in the useful volume is substantially orthogonally superimposed with the static magnetic field of the planar magnet arrangement. On the grounds of the specific arrangement of the magnetic poles of both magnetic fields, wherein the magnetic poles of the alternating magnetic field are respectively arranged with an offset in relation to the magnetic poles of the static magnetic field, subject to the appropriate selection of the operating parameters, orthogonality is automatically provided between the field lines of the static magnetic field and the field lines of the alternating magnetic field in the useful volume. As a result, a useful volume which extends parallel to the nuclear magnetic resonance sensor is defined, in which sufficiently good conditions are present for an NMR measurement. The useful volume is arranged in this case outside the nuclear magnetic resonance device. Moreover, on the grounds of the planar magnet arrangement, the sensor has a planar design. As a sensor of this type does not enclose the material sample, the size of the material sample to be scanned is not restricted. In particular, by means of a sensor of this type, planar objects can also be scanned, such as, for example, a house wall. On the grounds of the planar design, the sensor can in this case also be configured inter alia as a portable device, e.g. in the form of a hand-held device.

Moreover, on the grounds of the planar design, the sensor is particularly compact. As a result, an exceptionally favorable ratio of the sensor size to the useful NMR-sensitive volumes is provided. Compactness also results in easy portability of the sensor, or of a nuclear magnetic resonance device which is equipped with such a sensor.

In a first form of embodiment, it is provided that the planar magnet arrangement comprises a plurality of magnet segments which are arranged adjacently to one another, respectively having directions of magnetization which are oriented orthogonally to a second extension direction of the planar magnet arrangement. The magnet segments, which are arranged directly adjacently to one another along the first extension direction of the planar magnet arrangement, have in this case directions of magnetization which are rotated relative to one another, as a result of which a significantly stronger static magnetic field is generated on the front side of the planar magnet arrangement than on the reverse side of the planar magnet arrangement. As a result of the different orientation of the directions of magnetization of directly adjacent magnet segments, the magnetic flux of the static magnetic field can be essentially concentrated on the front side of the planar magnet arrangement. This arrangement, which can be configured, for example, in the form of a planar or convolute Halbach array, permits a significant increase in the field strength of the static magnetic field in the useful volume. A field strength of the requisite magnitude can in this case be achieved using relatively simple magnets, for example using standard magnets. This arrangement further permits a particularly flexible design of the sensor, wherein the number of magnetic poles and their position along the first extension direction of the planar magnet arrangement can be adjusted to the respective requirements.

In a further form of embodiment, it is provided that, along the first extension direction of the planar magnet arrangement, magnet segments which are arranged directly adjacently to one another have directions of magnetization which are respectively rotated through 45° in relation to one another. This results in a relatively simple structure, by means of which a sufficiently high concentration of the static magnetic field on the front side of the magnet arrangement is possible. At the same time, in comparison with a magnet arrangement having magnet segments which are rotated through 90° relative to one another, a significantly finer gradation of the magnetic field, and, associated therewith, a more uniform field distribution in the useful volume, can thus be achieved.

In a further form of embodiment, it is provided that, on the front side of the planar magnet arrangement, four magnetic poles having respectively alternating orientations are configured. The electrical coil of the measuring apparatus comprises in this case three adjacently arranged windings, the magnetic poles of which are respectively arranged between two directly adjacent magnetic poles of the planar magnet arrangement. This design constitutes an optimum arrangement, by means of which a sufficiently uniform magnetic field can be generated in the useful volume. Moreover, a relatively compact sensor module can be produced as a result.

In a further form of embodiment, it is provided that the electrical coil is further configured for measuring a signal which is based on the nuclear magnetic resonance of the material sample which is arranged in the useful volume. As a result, the structure can be simplified, as separate coils for excitation and for detection are not required. However, it is also possible for separate coils to be employed for excitation and detection.

In a further form of embodiment, it is provided that the electrical coil is arranged on the front side of the planar magnet arrangement. As a result, the sensitivity of the electrical coil is increased, particularly for the detection of the response signal.

In a further form of embodiment, it is provided that the electrical coil is configured in the form of a structured electrically conductive layer. As a result, a particularly planar design of the electrical coil, and thus of the entire sensor, is permitted. The electrical coil can in this case be generated, for example, by means of a photolithographic process, which permits a particularly high degree of precision.

In a further form of embodiment, it is provided that, in the electrically conductive layer, at least one shim coil is further designed for the homogenization of the static magnetic field which is generated by the planar magnet arrangement in the useful volume. By means of shim coils of this type, particularly precise magnetic fields are possible. However, the integration of the shim coil in the electrically conductive layer permits a particularly planar design.

In a further form of embodiment, it is provided that the electrical coil is configured in the form of a multiresonant coil. By means of the multiresonant coil, alternating fields at different frequencies can be generated or detected. Additionally, by means of the multiresonant coil, it is also possible for different layers to be scanned simultaneously, wherein the distinction between the individual layers can be achieved by means of a field-dependent contrast.

In a further form of embodiment, it is provided that an inner shielding structure of an electrically conductive material having a high magnetic permeability is arranged between the electrical coil and the planar magnet arrangement, the function of which is the shielding of the magnet segments from the alternating magnetic field of the electrical coil. By means of the inner shielding structure, shielding from the alternating magnetic field generated by the electrical coil can be provided in the region of the permanent magnets. As a result, mechanical forces acting on the permanent magnets on the grounds of the alternating magnetic or electromagnetic field are prevented. As mechanical forces of this type can corrupt the measuring signal, the measuring accuracy of the sensor can be increased by means of this measure.

In a further form of embodiment, it is provided that an outer shielding structure of an electrically conductive material having a high magnetic permeability is arranged between the electrical coil and the useful volume, the function of which is the shielding of the electrical coil from electromagnetic interference fields. By means of the outer shielding structure, unwanted electromagnetic influences on the magnetic coil can be prevented. The measuring accuracy can be increased as a result. By the employment of a material having a high magnetic permeability, any unwanted damping of the static magnetic field in the useful volume can be prevented.

In a further form of embodiment, it is provided that the outer shielding structure incorporates resonance structures, the function of which is the targeted shielding of electromagnetic interference fields with frequencies in the region of the network frequency. By means of such resonance structures, it is possible to produce a shielding structure which only screens out interference signals at specific frequencies. This is particularly necessary for frequencies in the region of the network frequency, as interference fields of this type commonly occur in technical applications. By the targeted shielding of network frequencies, the measuring accuracy can thus be significantly increased.

In a further form of embodiment, it is provided that the magnetic field generation apparatus comprises a carrier plate of a non-magnetic material, wherein the magnet segments are fitted into at least one opening in the carrier plate. This arrangement permits a particularly simple and cost-effective design. The individual magnet segments can in this case be fitted and removed in a relatively simple manner. It is thus possible for the magnet segments to be removed from the carrier plate, for example for the purposes of transport. Moreover, the static magnetic field can be damped by the rotation or interchange of the magnet segments within the carrier plate for the transport or storage of the sensor. Furthermore, the magnet segments can also be replaced individually, by means of which an adjustment of the static magnetic field to the respective application is possible.

In a further form of embodiment, it is provided that at least a proportion of the magnet segments of the magnet arrangement is rotatably configured within the carrier plate. It is thus possible for the static magnetic field to be adjusted to the respective requirements by the rotation of the individual magnet segments. In particular, by an appropriate rotation of specific magnet segments, the static magnetic field in the useful volume can be reduced, which is particularly advantageous for the storage and the transport of the nuclear magnetic resonance device.

In a further form of embodiment, it is provided that the magnetic field generation apparatus is extendable in a modular manner by the side-by-side arrangement of a plurality of carrier plates in at least one of the two extension directions of the planar magnet arrangement. This modular design permits a flexible adaptation of the size of the sensor by the discretionary extension thereof along both extension directions. Accordingly, it is also possible for larger objects to be scanned.

In a further form of embodiment, it is provided that magnet segments in an edge region of the planar magnet arrangement are configured to generate a static magnetic field with a higher magnetic field strength than magnet segments in a central region of the planar magnet arrangement. As a result, any attenuation of the magnetic field strength, which typically occurs in the edge regions of the magnet arrangement, can be counteracted. By the compensation of the field inconsistencies up to the edge, a uniform field strength can thus be achieved by means of the entire useful volume.

In a further form of embodiment, it is provided that the higher magnetic field strength in the edge region of the planar magnet arrangement is achieved by means of magnet segments which have a higher magnetization and/or a greater vertical extension than magnet segments in the central region of the planar magnet arrangement. By the employment of magnet segments having a higher magnetization in the edge region of the magnet arrangement, a particularly planar design of the sensor can be achieved. Conversely, by the employment of magnet segments having a greater vertical extension, even in the central region of the magnet arrangement, magnet segments having the maximum magnetization can be employed. As a result, overall, a significantly higher field strength can be achieved in the entire useful volume.

In a further form of embodiment, it is provided that, in the edge region of the planar magnet arrangement, a plurality of magnet segments which are arranged one on top of another are provided to achieve the higher magnetic field strength. By this arrangement, the field strength compensation in the edge region of the planar magnet arrangement can be achieved by means of standard magnets. The magnetic field generation apparatus can thus be constituted in a particularly simple and cost-effective manner.

In a further form of embodiment, it is provided that at least one part of the magnet segments of the planar magnet arrangement comprises a jacket made from a plastic. By way of a judicious selection of the layer thickness of the plastic jacket on each side of the magnet segment, the position of the respective magnet segment within the planar magnet arrangement can be defined. Particularly in an arrangement of a plurality of magnet segments within an opening in the carrier plate, by means of the thickness of the plastic jacket, the distance between the individual magnet segments can be accurately set. The plastic jacket further permits easier handling of the magnet segments for the purposes of fitting and removal, and for the purposes of transporting, the sensor.

A nuclear magnetic resonance device according to the disclosure comprising a corresponding sensor is further provided. The nuclear magnetic resonance device is in this case configured to independently of one another determine at least one material property of a material sample, which is arranged in a useful volume, for a plurality of measuring layers.

In one form of embodiment, it is provided that the nuclear magnetic resonance device comprises a lifting device for setting the distance between the sensor and a material sample which is arranged in the useful volume. The lifting device comprises in this case at least one electrically- and/or manually-operated actuator. By means of a lifting device of this type, depth-dependent measured values can be generated in a simple manner. As a result, an accurate depth profile of the scanned material sample can be constituted.

In a further form of embodiment, it is provided that the actuator comprises a first actuator part, which carries the sensor, and a second actuator part, which is configured in a moveable arrangement in relation thereto, having a contact surface for engaging with a contact surface which is arranged in a stationary manner in relation to the material sample. As a result, a particularly simple design is achieved.

In a further form of embodiment, it is provided that the first actuator part is configured in the form of an electric motor, whereas the second actuator part is configured in the form of a spindle which is driven by the electric motor. A spindle drive of this type permits a particularly precise adjustment of the height of the sensor.

In a further form of embodiment, it is provided that the lifting device comprises a plurality of actuators which are arranged in a distributed manner along the perimeter of the sensor. As a result, a particularly stable and precise adjustment of height is permitted.

BRIEF DESCRIPTION OF THE DRAWINGS

The disclosure is described in greater detail hereinafter with reference to the figures. In the figures.

The invention is described in greater detail hereinafter with reference to the figures. In the figures.

DETAILED DESCRIPTION

Figure 1:
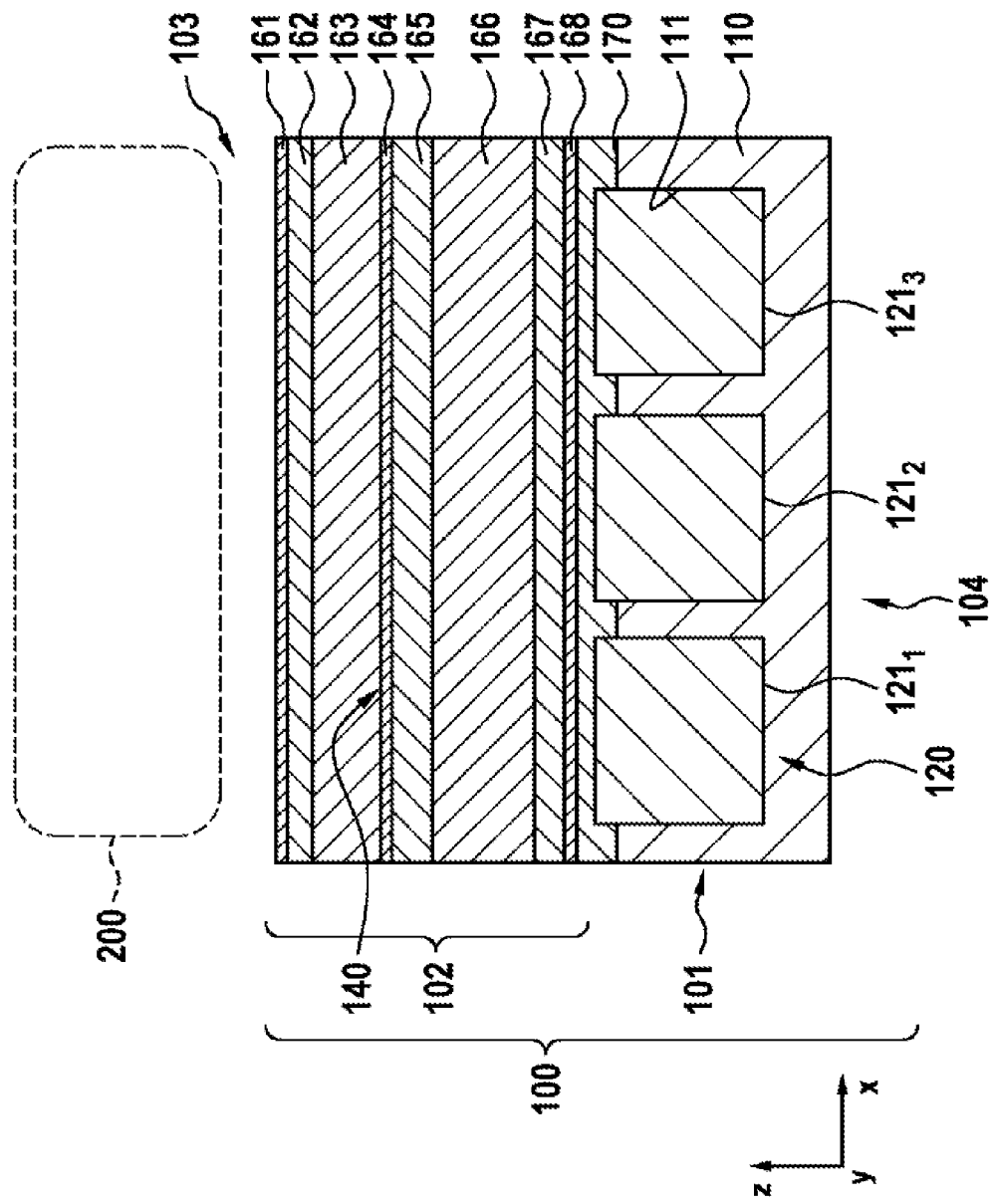
FIG. 1 shows a sensor for a nuclear magnetic resonance device comprising a magnetic field generation apparatus having a planar magnet arrangement, and a measuring apparatus in a schematic cross-sectional representation.

The nuclear magnetic resonance sensor according to the disclosure is characterized by a planar design which permits a measuring system which is open to the exterior and which, moreover, can be extended as required by way of a side-by-side arrangement of a plurality of sensors. The planar design of the sensor is achieved in this case by means of a special arrangement of permanent magnets for generating a B0 field, and by means of a special arrangement of at least one electrical coil for generating a B1 field. To this end, FIG. 1 shows a schematic cross-sectional representation of a nuclear magnetic resonance sensor 100 of this type. The sensor 100 comprises in this case a magnetic field generation apparatus 101 for generating a static magnetic field (B0 field) in a useful volume, and a measuring apparatus 102, which is arranged between the magnetic field generation apparatus 101 and the useful volume 200, for generating an excitation signal (B1 field) in the useful volume 200 and for measuring the consequent response signal.

The magnetic field generation apparatus 101 comprises in this case a planar arrangement 120 of a plurality of magnet segments $121_1$, $121_2$, $121_3$ which are arranged adjacently to one another in a plane. These are permanent magnets which, in the present exemplary embodiment, are configured with a cubic or cuboid shape, and thus have quadratic cross-sections. In principle, however, the magnet segments $121_1$, $121_2$, $121_3$ can also have other appropriate shapes, for example cylindrical or circular. The magnetic field generation apparatus 101 further comprises a carrier plate 110, which functions as a matrix for the accommodation of the magnet segments $121_1$, $121_2$, $121_3$. To this end, the carrier plate 110 comprises a plurality of openings 111, in each of which a magnet segment $121_1$, $121_2$, $121_3$ is arranged. The openings 111 in this case define the position and orientation of the magnet segments $121_1$, $121_2$, $121_3$ relative to one another. Alternatively, it is also possible for a plurality of magnet segments to be arranged within a common opening. In this case, the position and orientation of the magnet segments relative to one another can be defined by means of appropriate spacing structures, which are arranged between the magnet segments. If the magnet segments are provided with a plastic jacket, the mutual spacing of the magnet segments within the magnet arrangement can also be defined by the layer thickness of the plastic jacket. Moreover, it is also possible for the magnet segments to be arranged directly adjacently to one another even without a spacing.

The special arrangement of the magnet segments within the magnet arrangement 120 generates a magnetic field having defined properties within a specific spatial region 200 which, in FIG. 1, is arranged directly above the sensor 100. The spatial region 200 defines in this case a useful volume, which is characterized by a particularly high NMR sensitivity. In particular, given the appropriate selection of the operating parameters, the magnetic fields generated by the sensor 100 show a particularly high degree of uniformity in the useful volume 200.

As further illustrated in FIG. 1, the measuring apparatus 102 is configured in the form of a layer stack comprising a plurality of layers 161, 162, 163, 164, 165, 166, 167, 168. The layer stack comprises in this case an electrically conductive layer 164, which is preferably arranged on a carrier substrate 165, preferably a circuit board such as, for example, a PCB. The electrically conductive layer 164 incorporates in this case an electrical coil 140 having one or more windings which are arranged adjacently to one another (not represented here). The electrical coil 140 which, in the present exemplary embodiment, has been generated by the structuring of the electrically conductive layer 164, constitutes an essential component of the measuring apparatus 102. In the operation of the sensor 100, the electrical coil 140 generates an alternating magnetic field (B1 field) which, in the useful volume 200, is essentially orthogonally superimposed with the magnetic field of the planar magnet arrangement 120, and functions as an excitation signal for the nuclear magnetic resonance measurement. Additionally, at the same time, the electrical coil 140 preferably constitutes an antenna for the detection of the response signal which succeeds the excitation signal. A pulsed magnetic field, for example, serve as an alternating field 150. However, depending on the application, other temporally variable electromagnetic fields can also be employed as an excitation signal (B1 field).

In addition to the electrical coil 140, the electrically conductive layer 164 can also comprise at least one further electrical coil, in particular a shim coil, for the correction of the alternating magnetic field generated by the electrical coil 140. In addition, further passive and active components can also be arranged on the carrier substrate 165, preferably in the edge regions.

In order to prevent any unwanted influence on the measurement by external alternating electromagnetic fields, the measuring apparatus 102 can further comprise an external shielding structure. The shielding structure can have in this case a specific structuring, which function as resonance structures for the filtering-out of electromagnetic radiation at specific frequencies such as, for example, the network frequency (50 Hz). In FIG. 1, the outer shielding structure is configured in the form of a structured metal layer 161, which consists, for example, of copper or of another non-magnetic metal. The outer shielding structure 161 is arranged in this case on a dedicated carrier substrate 162. The carrier substrate 162 can be configured, for example, in the form of a baseplate, and can have a relatively small layer thickness, for example 1 mm. In order to set the clearance between the electrical coil 140 and the outer shielding structure 161, a first separating layer 163 having a specific layer thickness is also provided between the electrically conductive layer 164 and the carrier substrate 162. The layer thickness is preferably a few millimeters, for example 2 mm. As a material for the first separating layer 163, any appropriate non-metallic material can be employed in this case, for example an acrylic plate.

The measuring apparatus 102 can further comprise an inner shielding structure, which shields the magnet segments of the planar magnet arrangement 120 from the alternating magnetic field of the electrical coil 140. By means of an inner shielding structure of this type, it can be prevented that, on the grounds of the alternating magnetic field of the electrical coil 140, mechanical forces act on the magnet segments, which result in a corruption of the measuring signal. In FIG. 1, the inner shielding structure is configured in the form of a thin metallic layer 168 which is arranged between the electrical coil 140 and the magnet segments of the magnet arrangement 120. As a material for the inner shielding structure 168, for example, copper or another non-metallic metal is in this case considered. The inner shielding structure 168 can in this case be arranged on a dedicated substrate layer 167, which preferably has a small layer thickness, for example 1 mm. The substrate layer 167 can in this case consist of any appropriate material, in particular of a non-magnetic material such as, for example, cardboard or laminated paper. A second separating layer 166 can further be provided between the two electrically conductive layers 164, 168, by means of which the exact clearance between the electrical coil 140 and the inner shielding structure 168 can be established. This separating layer 166 preferably has a layer thickness of a few millimeters, for example 2 mm. The separating layer 166 can be formed in this case from any appropriate material, for example a non-magnetic material.

The measuring apparatus 102 represented in FIG. 1 comprises a total of eight layers 161-168. In principle, however, by the consolidation of the substrate and the separating layers, it is possible to reduce the number of layers, and thus to reduce the requisite manufacturing steps. Thus, for example, the substrate layer 162 and the separating layer 163 can be configured as a common layer. The separating layer 166 can also constitute a common layer with the substrate layer 165 and/or the substrate layer 167 (not represented here).

On the grounds of the laminated structure and the small layer thicknesses of the layers 161-168, the measuring apparatus 102 has a relatively small overall height, for example 10 mm.

In order to set a specific clearance between the planar magnet arrangement 120 and the measuring apparatus 102, a further separating layer 170 can be provided between the two components. The separating layer 71 preferably in this case consists of a non-magnetic material such as, for example, an acrylic plate. In the present exemplary embodiment, the acrylic plate 170 incorporates recesses, which accommodates the regions of the magnet segments $121_1$, $121_2$, $121_3$ which project from the carrier plate 110.

Figure 2:
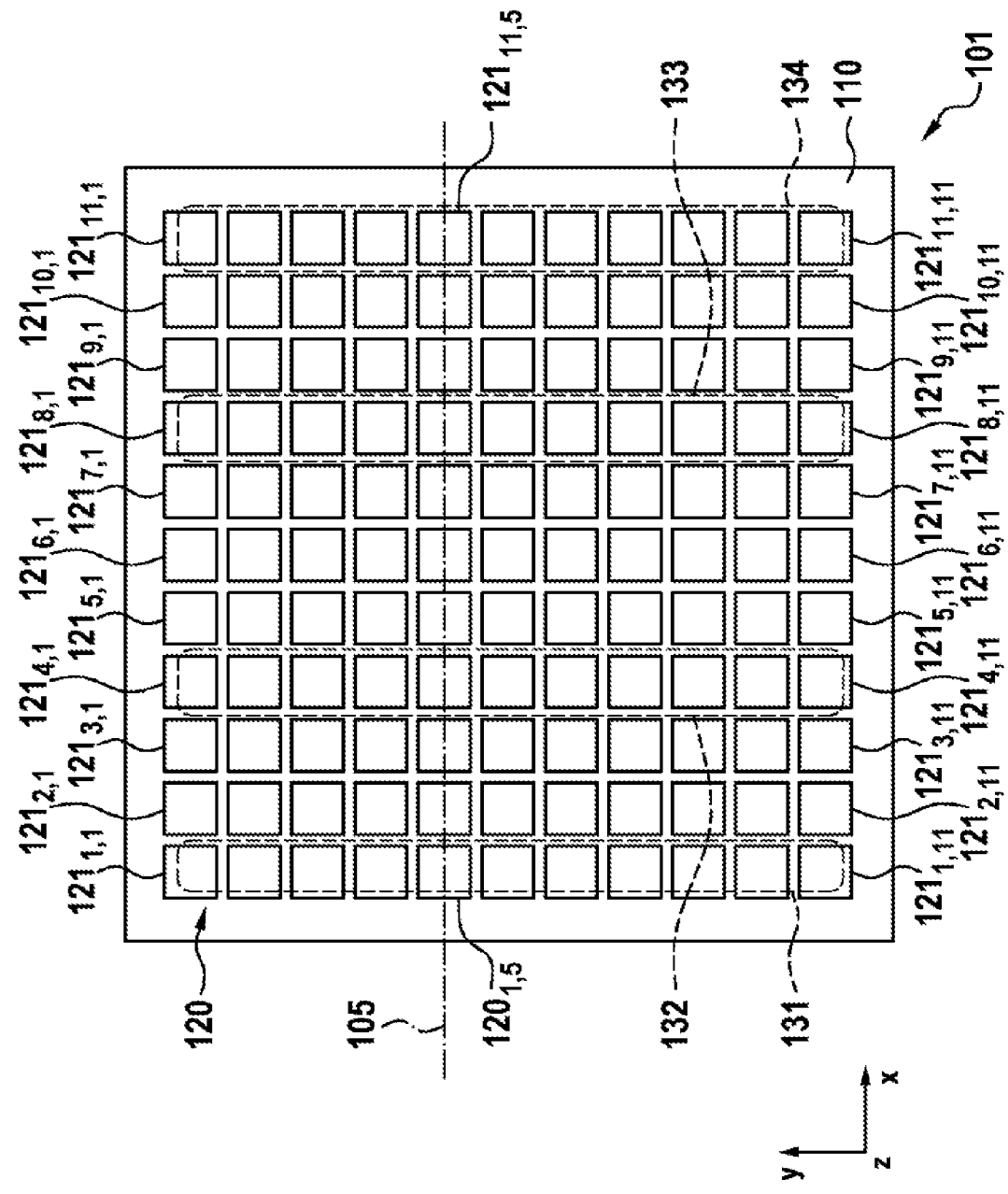
FIG. 2 shows an overhead view of the magnetic field generation apparatus of the sensor having the planar magnet arrangement from FIG. 1.

The planar magnet arrangement 120 typically comprises a plurality of magnet segments arranged adjacently to one another in a plane, the number and spatial arrangement of which in this case can vary depending on the respective application. FIG. 2 shows an exemplary overhead view of a planar magnet arrangement 120 extending in the XY plane and having a total of 121 magnet segments $121_{1,1}$-$121_{11,11}$ arranged within the carrier plate 110. The magnet segments $121_{1,1}$-$121_{11,11}$ are preferably uniformly distributed over the carrier plate 110 and, in the present exemplary embodiment, constitute an 11×11 matrix with 11 rows and 11 columns. The magnet segments $121_{1,j}$-$121_{11,j}$ (where j=1, 2, 3, ... 11) which are arranged directly adjacently to one another in the first extension direction X of the magnet arrangement 120 respectively have different directions of magnetization, as a result of which a magnetic field having a plurality of magnet poles is generated, which is essentially concentrated on the front side 103 of the planar magnet arrangement. By way of distinction, the magnet segments $121_{i,1}$-$121_{i,11}$ (where i=1, 2, 3, ... 11) in a column which are arranged adjacently to one another along a second extension direction Y of the planar magnet arrangement 120 preferably have the same direction of magnetization. In the present exemplary embodiment, the planar magnet arrangement 120 comprises a total of four magnet poles 131, 132, 133, 134, having respectively alternating magnetic field directions, which are represented in FIG. 2 by broken lines.

Figure 3:
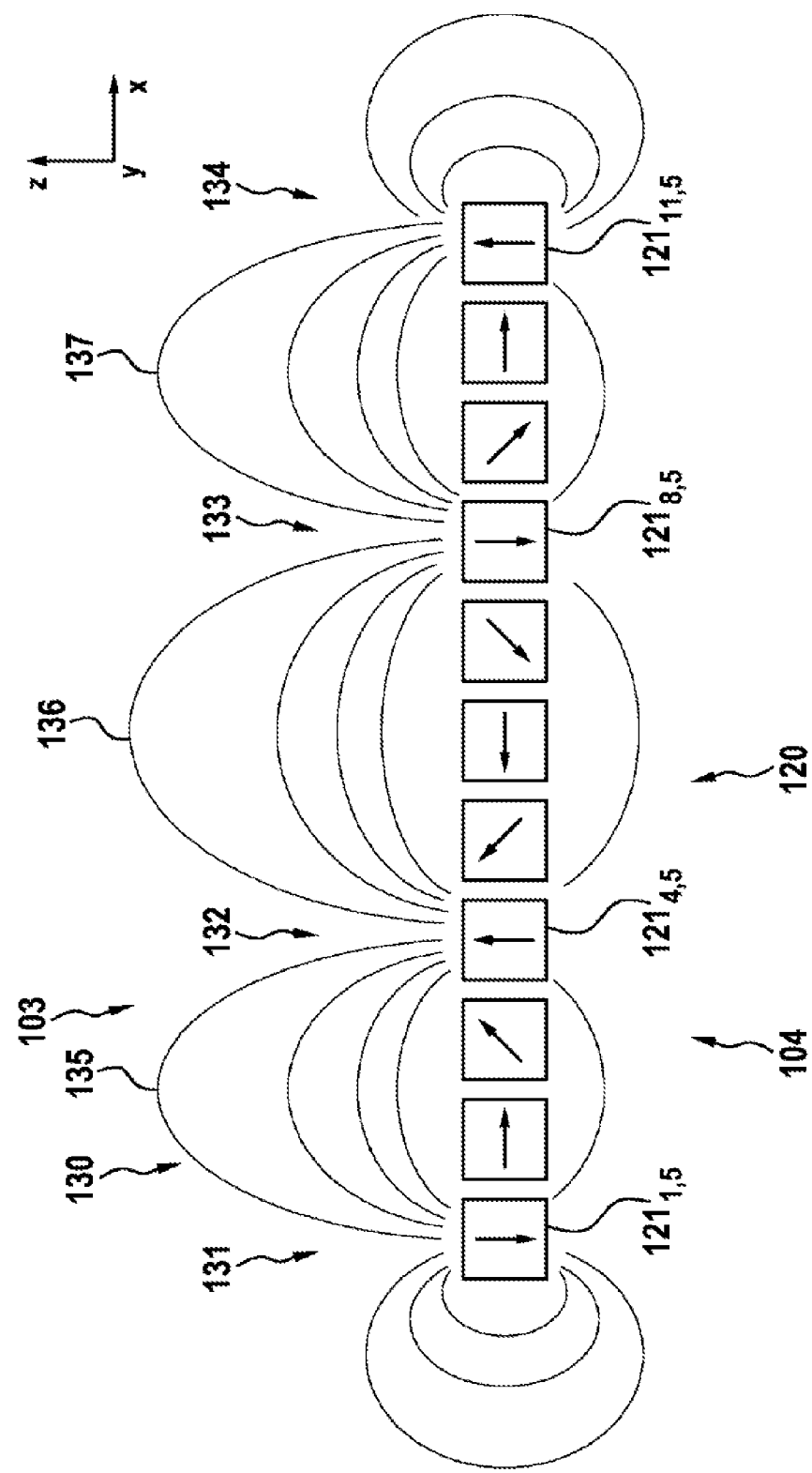
FIG. 3 shows a schematic side view of the planar magnet arrangement having eleven magnet segments arranged adjacently to one another, having directions of magnetization which are respectively rotated through 45°.

For the purpose of clarification, FIG. 3 shows a cross-section through the planar magnet arrangement 120 from FIG. 2 along line 105, wherein the orientations of the magnetization of the magnet segments are represented by means of corresponding arrows. It can be seen here that the directions of magnetization of magnet segments $121_{1,5}$-$121_{11,5}$ which are arranged directly adjacently to one another are respectively rotated through a specific angle relative to one another. By the rotation of the orientation of the magnetization of adjacent magnet segments, a specific magnet arrangement is achieved, which essentially corresponds to a Halbach array. By means of such a configuration of permanent magnets, it is possible for the magnetic flux on a first side of the magnet arrangement to be virtually eliminated, whereas said flux is amplified on the second side which is arranged opposite the first side. Thus, the magnetic field 130, which is schematically represented in FIG. 3 by means of the field lines, is primarily concentrated on the front side 103 of the planar magnet arrangement 120, which is oriented toward the useful volume 200, whereas said field is relatively weakly pronounced on the reverse side 104 of the planar magnet arrangement 120.

In the present exemplary embodiment, the angle of rotation of the magnet segments $121_{2,5}$-$121_{10,5}$ is 45° in each case. Only the two magnet segments $121_{1,5}$, $121_{11,5}$ arranged at the outermost edge of the magnet arrangement are respectively rotated through 90° relative to their neighbors. As a result, potential distortions of the static magnetic field 130 in the edge region 127 of the magnet arrangement are reduced. In principle, the angle of rotation between adjacent magnet segments can vary in this case depending on the respective application. In particular, in the event of the employment of a larger number of separate magnet segments, a smaller angle of rotation can be employed than in the event of a smaller number of magnet segments.

Figure 4:
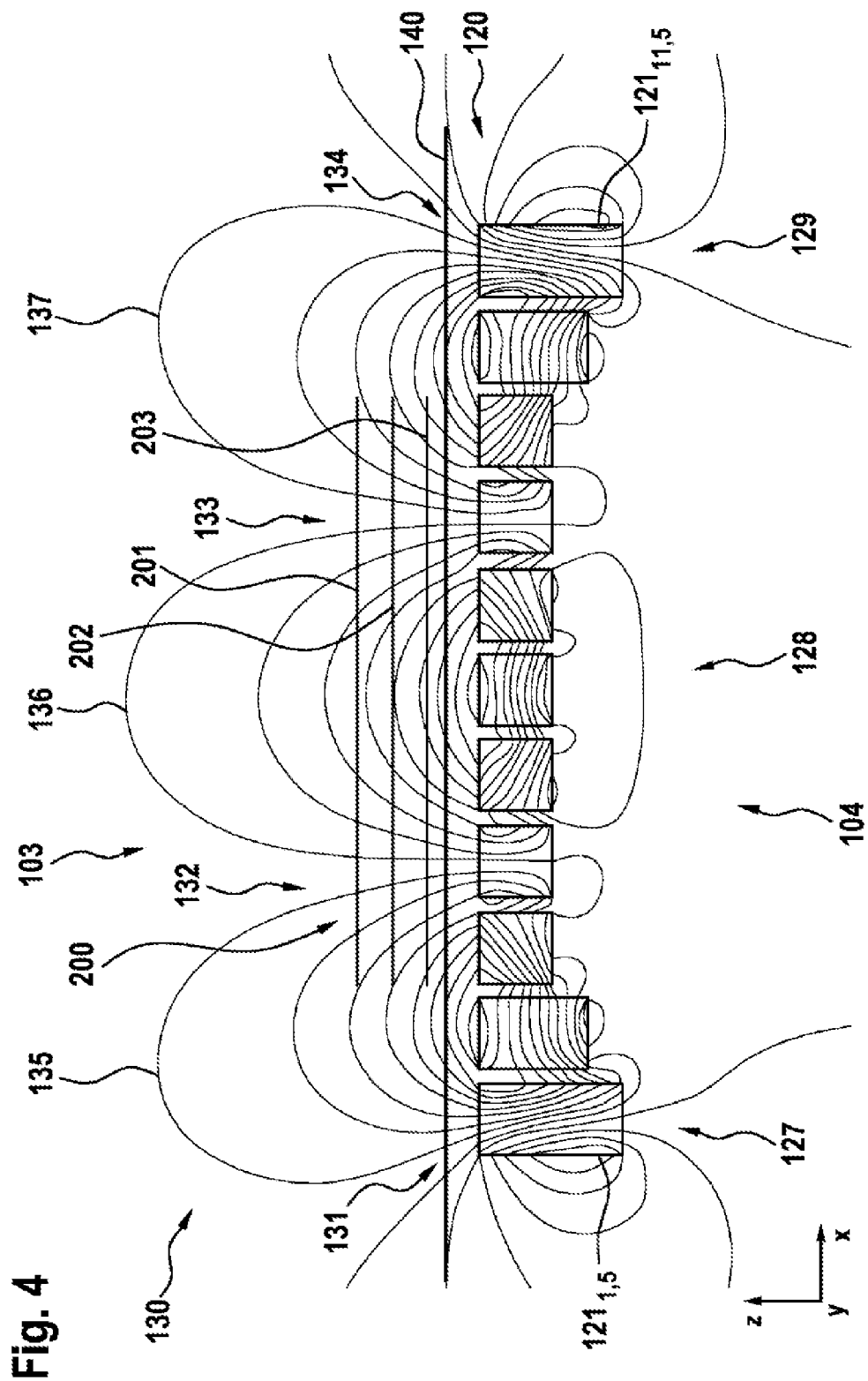
FIG. 4 shows a side view of a planar magnet arrangement having a magnetic field which is essentially arranged on the front side.

In order to compensate an attenuation of the static magnetic field 130 in the edge regions 127 of the planar magnet arrangement 120, stronger magnet segments can be employed in the corresponding edge regions 127 than in a central region 128 of the magnet arrangement. Such a strengthening of the magnetic field in the edge regions 127 can in this case be avoided, for example, by means of magnet segments which, in comparison with the magnet segments from a central region 128 of the magnet arrangement, are configured to a larger or higher dimension. To this end, FIG. 4 shows a corresponding planar magnet arrangement 120 having magnet segments $121_{1,5}$-$121_{11,5}$ of different heights. By the compensation of the magnetic field attenuation in the edge regions 127 of the magnet arrangement 120, the two outer subsections 135, 137 of the static magnetic field 130 have an essentially equal strength to the central subsection 136 of the static magnetic field 130. This results in an essentially uniform field strength of the static magnetic field 130 in the various measuring layers of the useful volume 200. In FIG. 4, in the interests of clarity, only three of the measuring layers which define the useful volume 200 are represented by the lines 201, 202, 203. As represented here, the measuring layers 201, 202, 203 are preferably located above the electrical coil 140. By means of the high degree of uniformity of the magnetic fields achieved in the measuring layers, it is possible for various atomic nuclei to be measured simultaneously.

A distinction between the different atomic nuclei can be achieved here by means of the T1/T2 relaxation.

Figure 5:
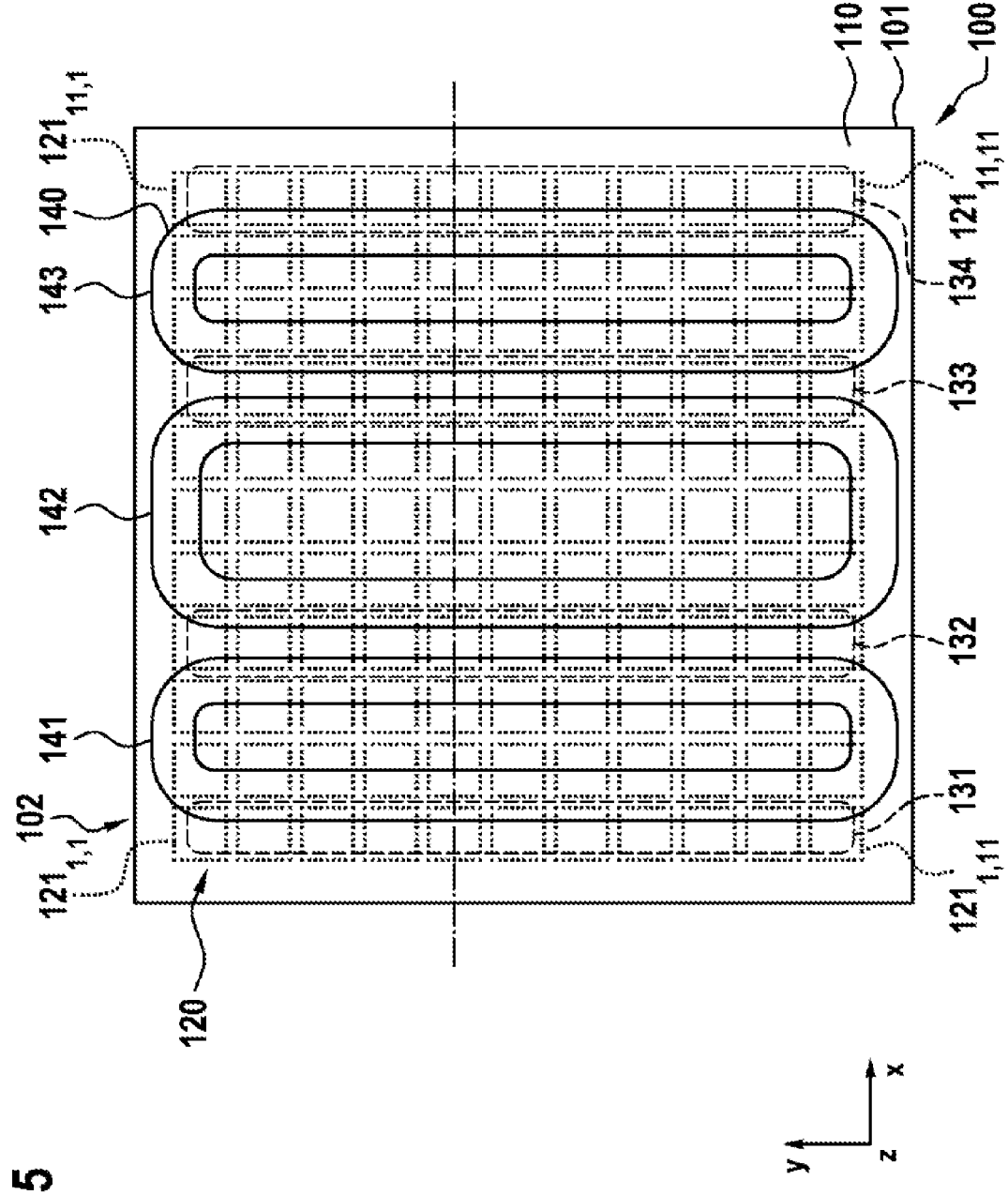
FIG. 5 shows a schematic overhead view of the planar magnet arrangement having four magnet poles and an electrical coil comprising three windings.

An arrangement of the electrical coil 140 in relation to the planar magnet arrangement 120 is schematically represented in FIG. 5. It can be seen here that, in the present exemplary embodiment, the electrical coil 140 comprises a total of three windings 141, 142, 143. The windings or the inner regions of the windings are respectively arranged here between two immediately adjacent magnet poles 131, 132, 133, 134.

Figure 6:
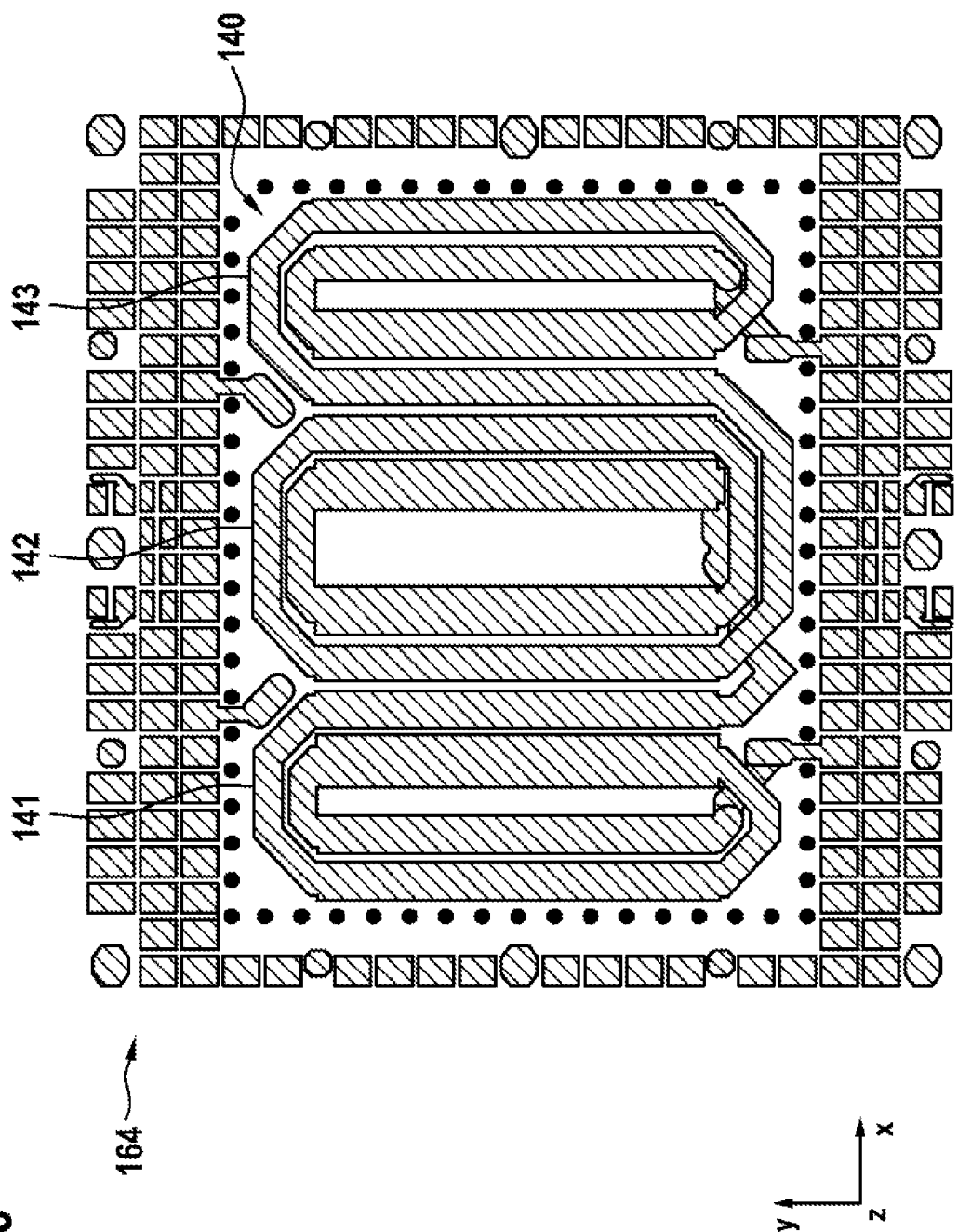
FIG. 6 shows an overhead view of an electrical coil having three developments which is generated by the structuring of an electrically conductive layer.

FIG. 6 shows a potential design of an electrical coil 140 having three windings 141, 142, 143 which are arranged adjacently to one another and which have been generated, for example, by the structuring of the electrically conductive layer 164. The windings 141, 142, 143, which are arranged adjacently to one another, of the electrical coil 140 represented in FIG. 6 are configured here in the form of sub-coils, wherein, in the present case, each sub-coil comprises two windings. In principle, the number of windings per sub-coil can vary depending on the application. Moreover, it is possible for the electrical coil 140 to be constituted in the form of a multi-resonant coil, by means of which alternating fields at different frequencies can simultaneously be emitted or detected. By means of a multi-resonant coil, different layers of the useful volume 200 can be scanned simultaneously. The distinction between the different layers can be executed herein by means of a field-dependent contrast. To this end, for example, a magnetic field-dependent contrast medium can be employed.

Figure 7:
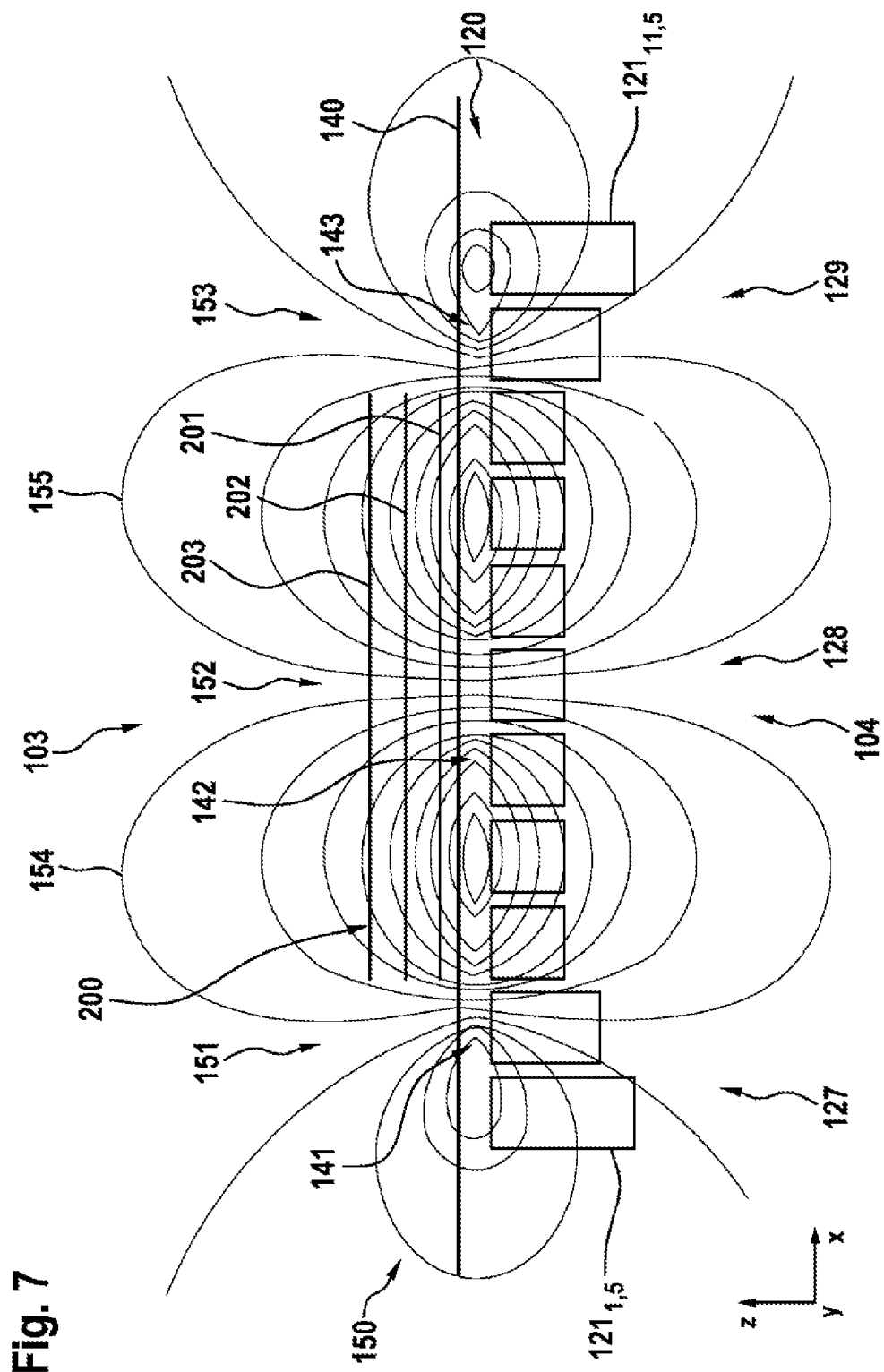
FIG. 7 shows a side view of the planar magnet arrangement from FIG. 4 and of the electrical coil, constituted in the electrically conductive layer, for the purpose of clarifying the alternating magnetic field generated by the electrical coil.

FIG. 7 shows an arrangement which corresponds to the configuration from FIG. 4, wherein, in this case, only the alternating magnetic field 150 of the electrical coil 140 is represented. As can be seen here, the alternating magnetic field 150 which, in service, is generated by the three sub-coils 141, 142, 143, on the upper side which faces the useful volume 200, comprises a total of three magnet poles 151, 152, 153.

Figure 8:
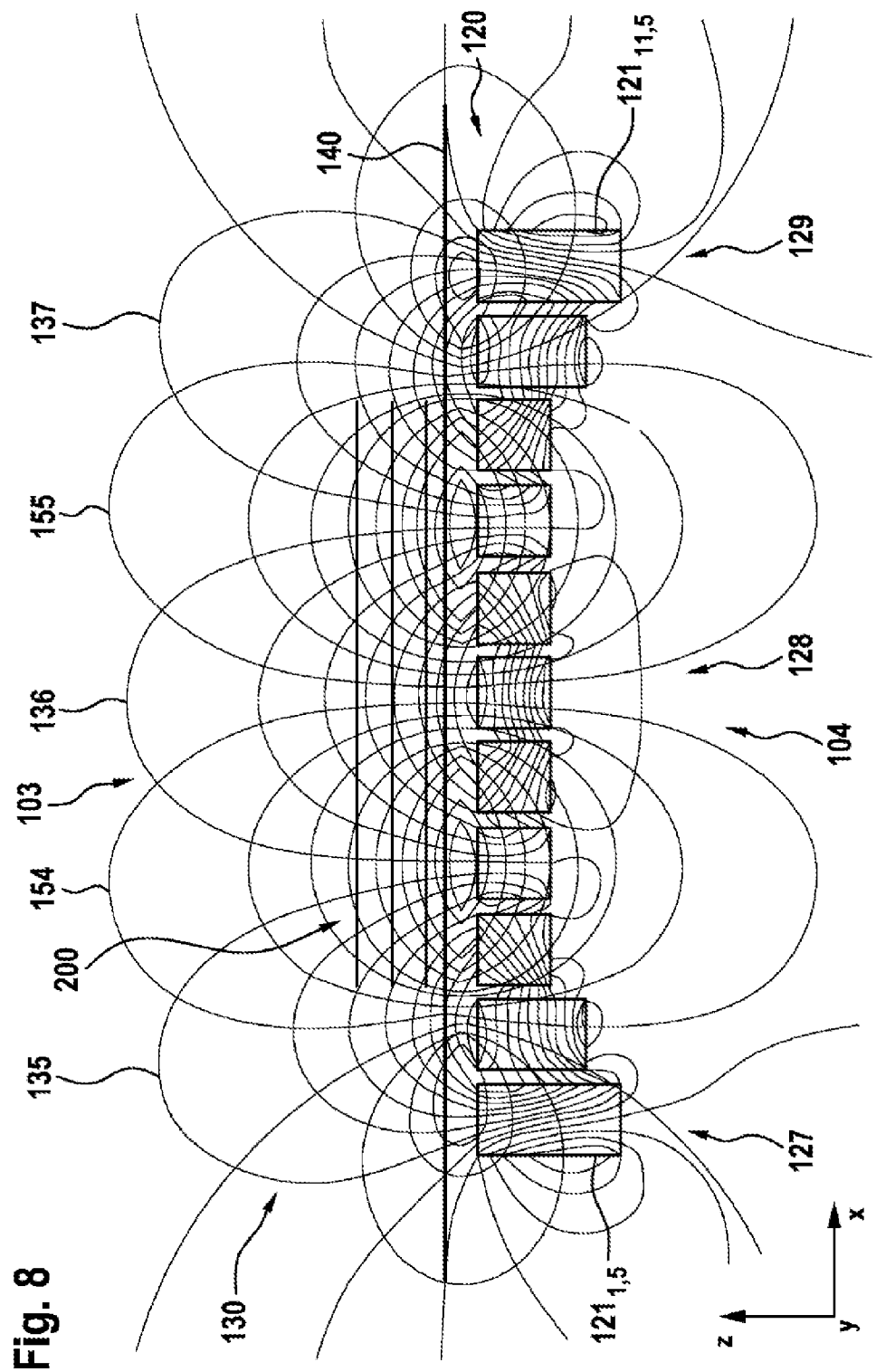
FIG. 8 shows a side view of the planar magnet arrangement from FIG. 4 and of the electrical coil from FIG. 7, for the purpose of clarifying the superimposition of the magnetic fields generated by the planar magnet arrangement and the electrical coil.

FIG. 8 shows a superimposition of the static magnetic field 130 from FIG. 4 and of the alternating magnetic field 150 from FIG. 7. It can be seen here that the two magnetic fields 130, 150 comprise magnet poles which are respectively offset in relation to one another, wherein, in each case, one magnet pole 151, 152, 153 of the alternating magnetic field 150 is essentially centrally arranged between two directly adjacent magnet poles 131, 132, 133, 134 of the static magnetic field 130. As a result of this special arrangement, it proceeds that the field lines of both magnetic fields 130, 150 in the useful volume 200 defined by the usable measuring layers 201, 202, 203 extend essentially orthogonally with respect to each other. By means of a corresponding adjustment of the operating parameters or of the configuration, an optimum field distribution for NMR measurement can be achieved here in the useful volume 200.

Figure 9:
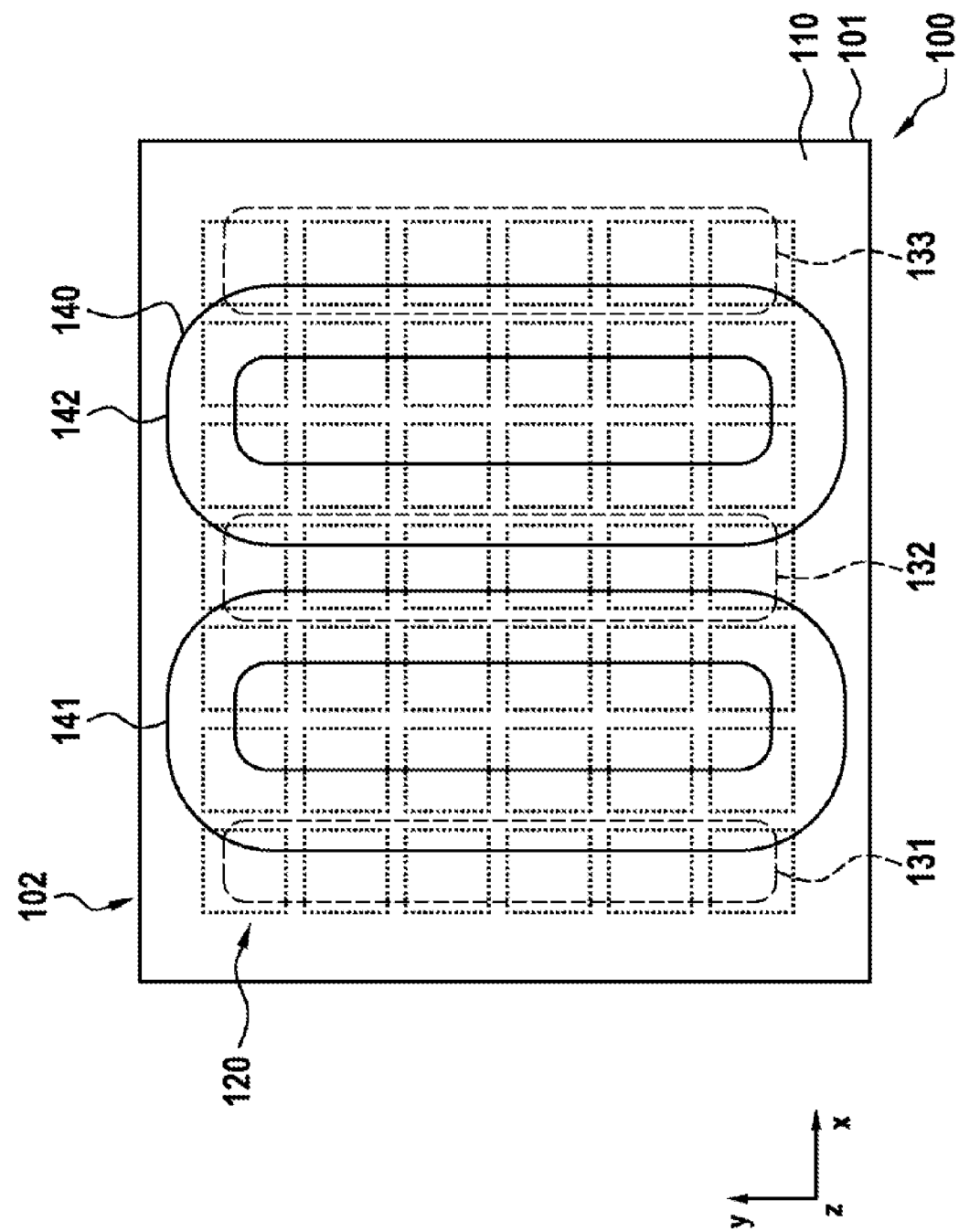
FIG. 9 shows an overhead view of a sensor having a planar magnet arrangement having three magnet poles arranged adjacently to one another, and an electrical coil having two windings arranged adjacently to one another.

In principle, the sensor 100 can also be manufactured in different sizes. The number of magnet segments employed on the number of sub-coils can vary here. To this end, FIG. 9 shows a downsized version of the sensor 100 from FIG. 5. The sensor 100 comprises a planar magnet arrangement 120 having a total of 41 magnet segments 41 arranged in a 7×6 matrix. The magnetic field generated by the planar magnet arrangement 21 comprises only three magnet poles 131, 132, 133 on the front side. Correspondingly, the electrical coil 41 comprises only two windings or sub-coils 141, 142.

Figure 10:
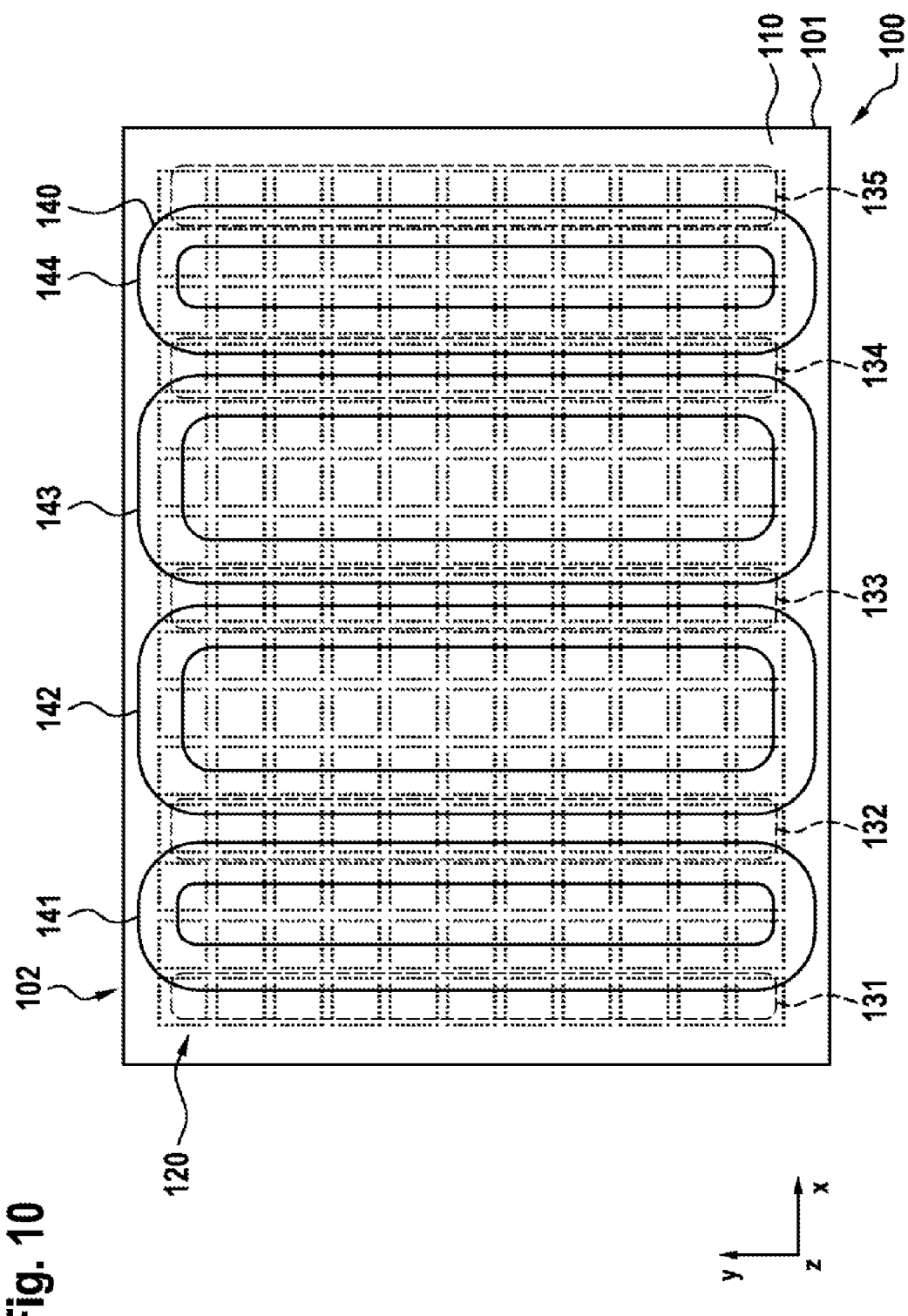
FIG. 10 shows an overhead view of a sensor having a planar magnet arrangement having four magnet poles arranged adjacently to one another, and an electrical coil having three windings arranged adjacently to one another.

By way of distinction, FIG. 10 shows an enlarged version of the sensor 100 from FIG. 5. The enlarged sensor 100 comprises a planar magnet arrangement 21 having a total of 150 magnet segments arranged in a 15×10 matrix. The static magnetic field on the front side of the planar magnet arrangement 120 comprises here a total of five magnet poles 131, 132, 133, 134, 135 having alternating field directions. Correspondingly, the electrical coil 41 comprises a total of four windings or sub-coils 141, 142, 143, 144.

Figure 11:
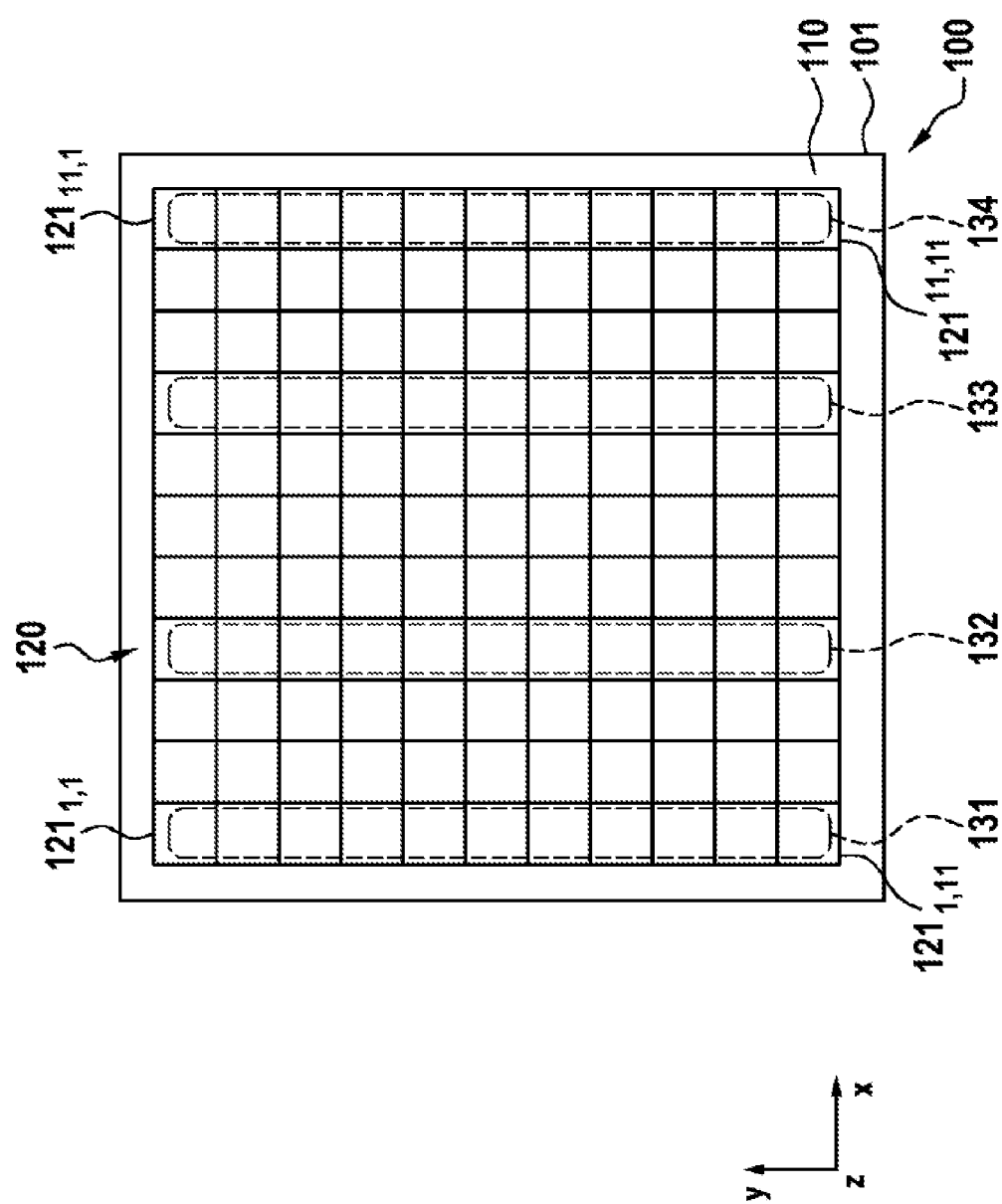
FIG. 11 shows a schematic overhead view of a planar magnet arrangement consisting of separate magnet segments, which are arranged in the form of a 11×11 matrix.

In principle, the magnet segments of the planar magnet arrangement 120 can also be arranged next to one another in a gapless arrangement. To this end, FIG. 11 shows a corresponding configured planar magnet arrangement 120.

Figure 12:
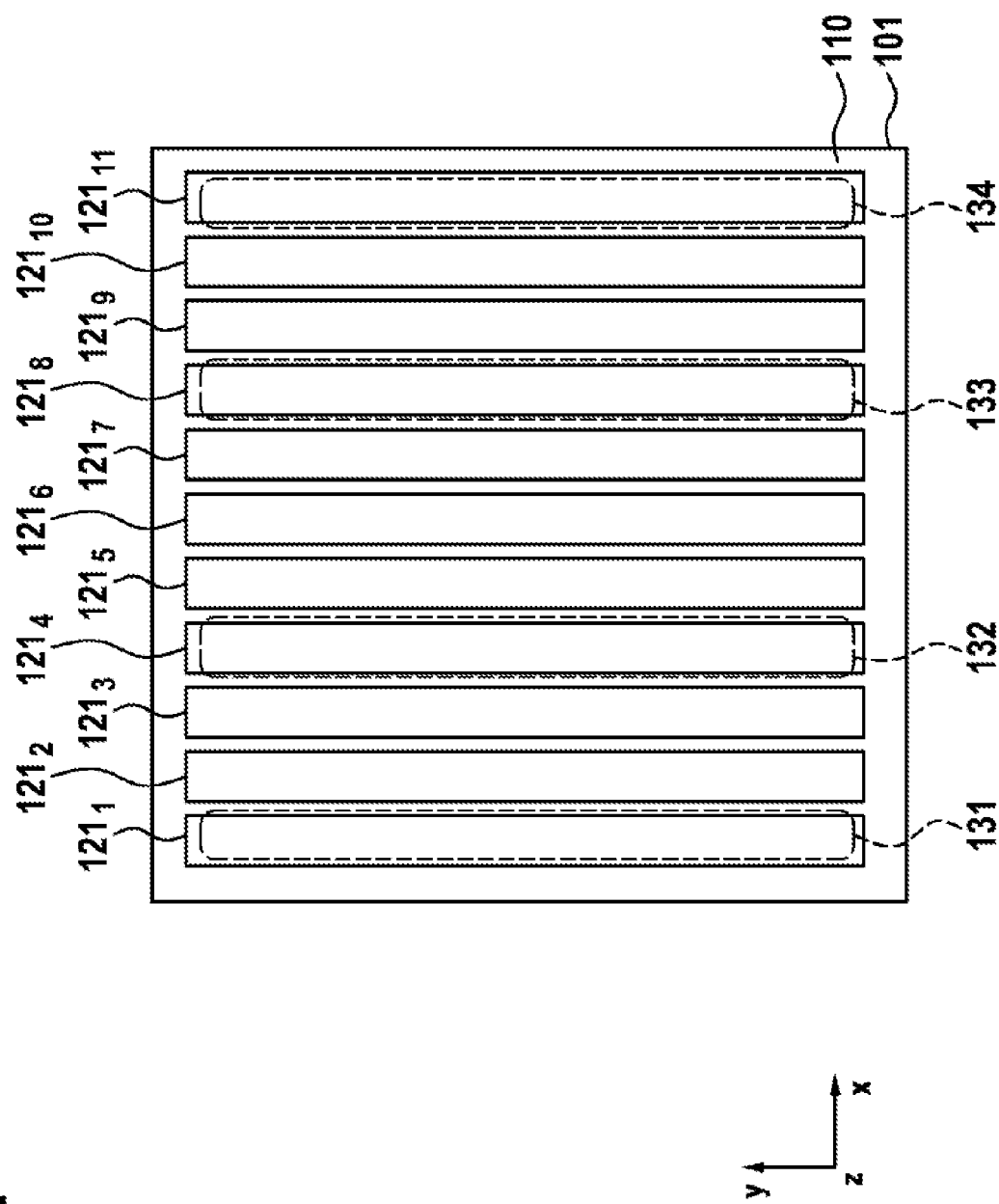
FIG. 12 shows a schematic overhead view of a planar magnet arrangement consisting of a total of eleven prismatic magnet segments.

In addition to a matrix-shaped arrangement of the magnet segments, which is shown, for example, in FIG. 2, the planar magnet arrangement, in principle, can also be constituted by way of a side-by-side arrangement of elongated magnet segments. To this end, FIG. 12 shows a corresponding planar magnet arrangement 21, comprising a total of eleven rod- or bar-shaped magnet segments which are arranged adjacently to one another in the first extension direction X.

Figure 13:
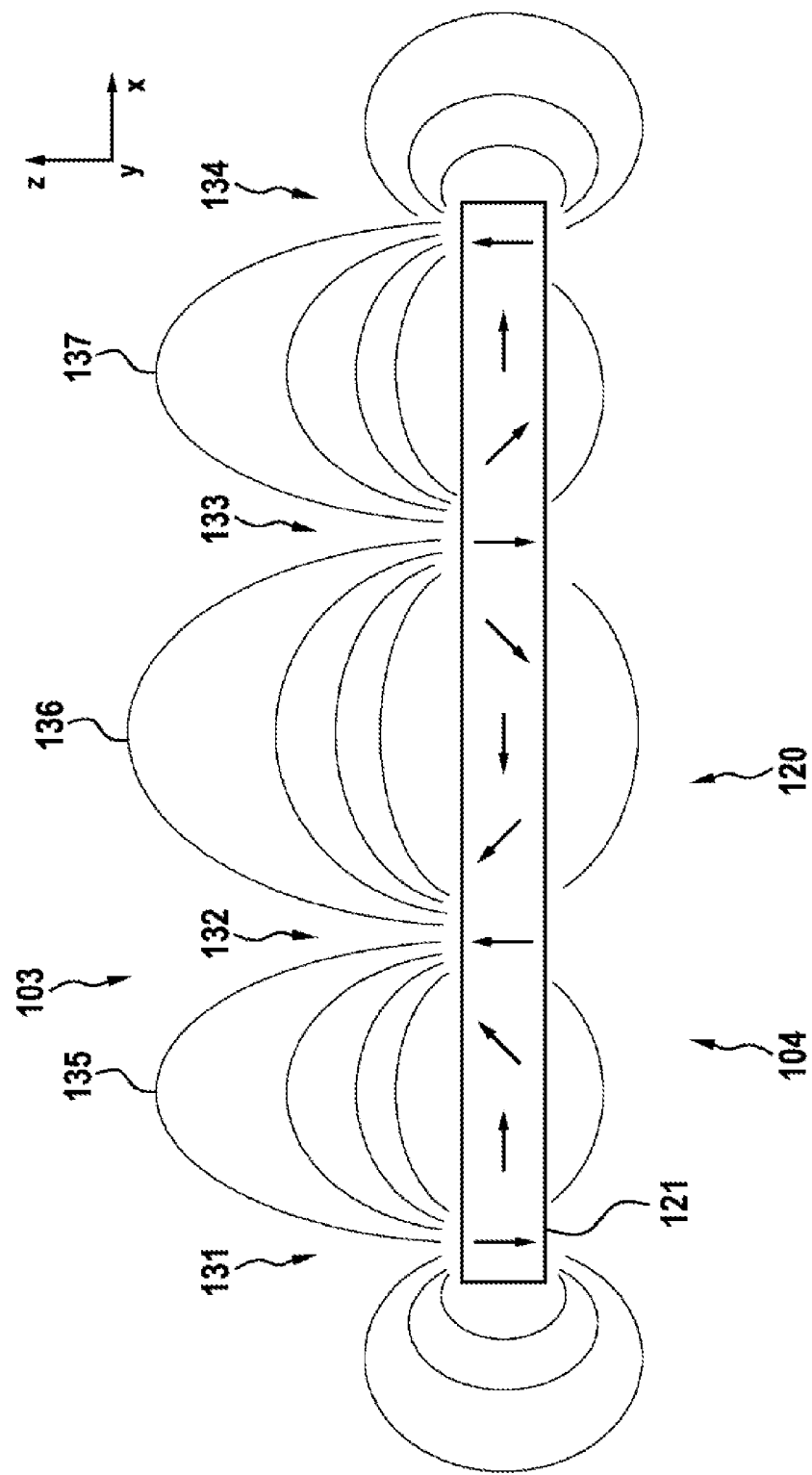
FIG. 13 shows a schematic side view of a planar magnet arrangement comprising a magnet segment which extends over the full width and which has regions with differently oriented magnetization.

In principle, it is possible to employ magnet segments having a complex magnetization. To this end, FIG. 13 shows a planar magnet arrangement 120 having a single magnet segment 121, which comprises sections having a differing magnetization direction. In particular, directly adjacent sections of the magnet segment 121 respectively have magnetization directions which are rotated through a specific angle. A permanent magnet of this type can be produced, for example, by sintering.

Figure 14:
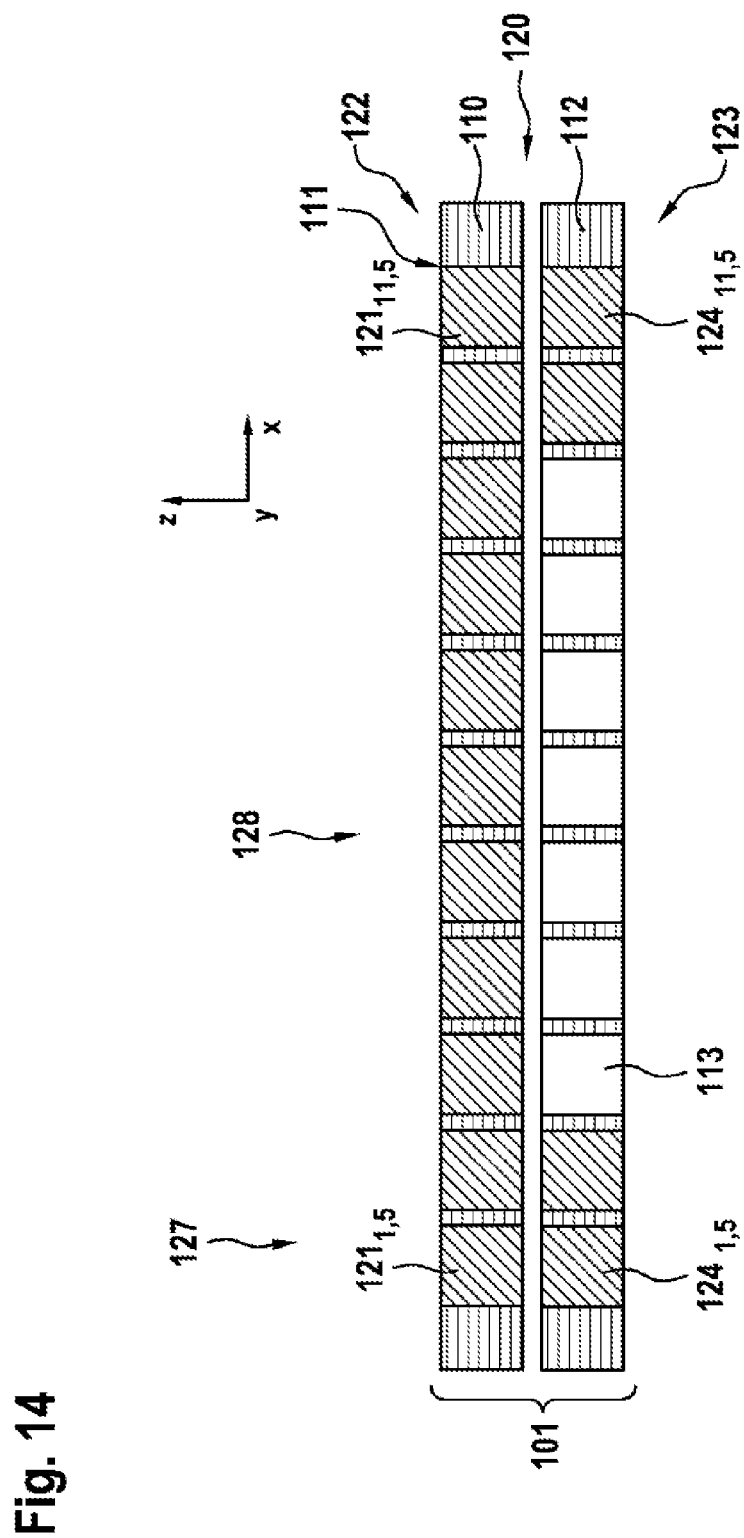
FIG. 14 shows a schematic cross-sectional view of a planar magnet arrangement having carrier plates arranged in two planes one on top of the other, with magnet segments.

In order to achieve a compensation of the attenuation of the magnetic field in the edge regions 127 of the planar magnet arrangement 120, as an alternative to the employment of magnet segments of different sizes, described with reference to FIG. 4, it is also possible to employ a three-dimensional arrangement of magnet segments. To this end, FIG. 14 shows a cross-sectional representation of a planar magnet arrangement 120 which is correspondingly extended in the Z-direction. The magnet segments are arranged in this case in two planes 122, 123, arranged one on top of the other. To this end, the magnetization apparatus 101 comprises an additional carrier plate 112, which is fastened below the first carrier plate 110. The second carrier plate 112 only comprises here magnet segments $124_{1,5}$-$124_{11,5}$ in its edge regions 127. In the central region 128 of the second carrier plate 112, conversely, no magnet segments are present. By the superimposition of the magnetic fields of the magnet segments which are arranged one on top of another in the edge regions 121 of the magnet arrangement, the desired amplification of the static magnetic field 130 in the edge regions 127 is achieved.

Figure 15:
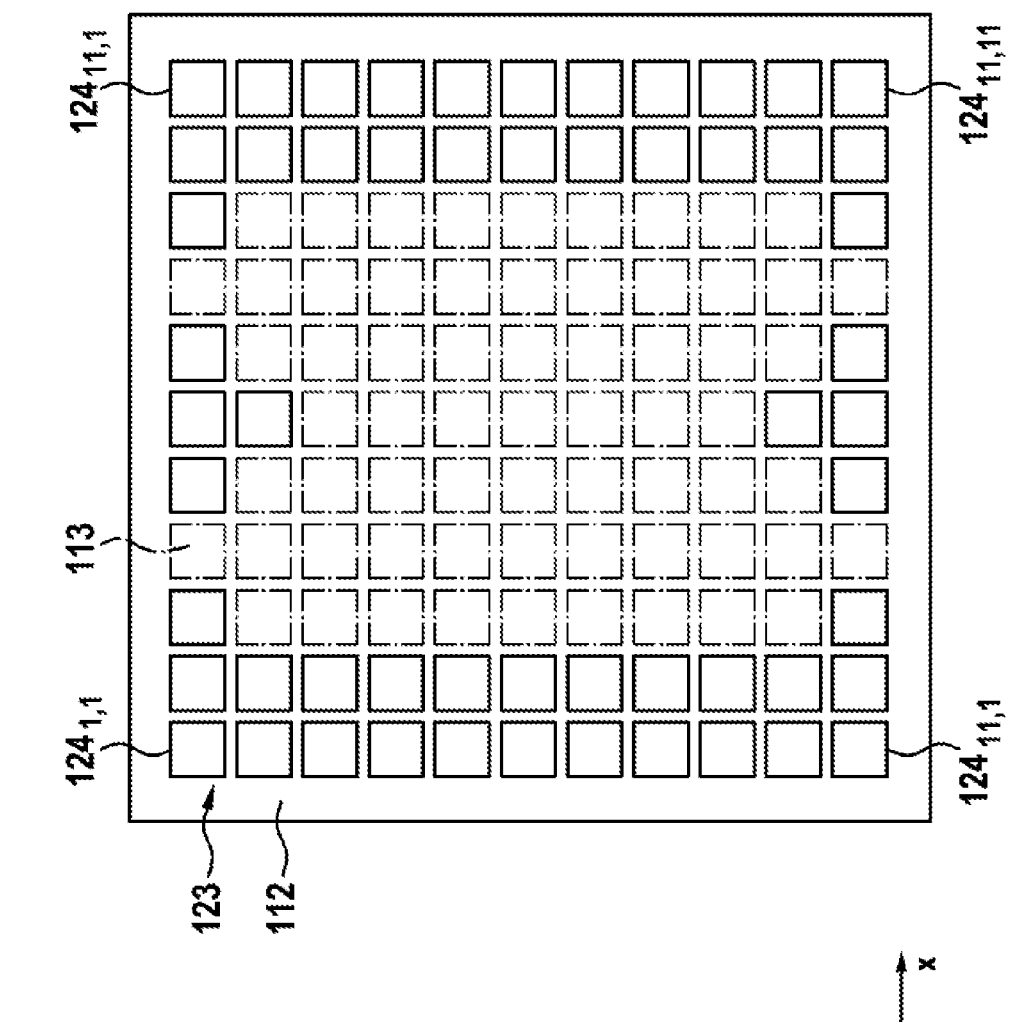
FIG. 15 shows a schematic overhead view of the lower carrier plate for the purpose of clarifying the specific arrangement of the magnet segments in the lower carrier plate.

FIG. 15 shows an overhead view of the additional carrier plate 112 from FIG. 14. It can be seen here that furthermore the additional carrier plate 112 also comprises additional magnet segments $124_{1,1}$-$121_{11,11}$ in a central region oriented in the X-direction. In the interests of the clearer illustration of the distribution of the magnet segments $124_{1,1}$-$121_{11,11}$ within the carrier plate 112, the openings 113 in the carrier plate 112, in which no corresponding magnet segment is located, are represented by a dash-dotted line.

In principle, by the addition or removal of magnet segments from the openings 113 in the lower carrier plate 112, the static magnetic field 130 of the magnetic field generation apparatus 101 can be modified in a desired manner. Moreover, it is also possible for the magnet segments to be arranged in more than two planes one on top of another.

The employment of a carrier plate with removable magnets permits a relatively simple variation of the magnet arrangement. As a result, the planar magnet arrangement can, in principle, be adapted to the respective application. Moreover, by the rotation of individual magnet segments within the carrier plate, the static magnetic field (B0 field) can be damped, or even virtually entirely compensated, for the purpose of transport or storage of the sensor. An analog reduction of the magnetic field can be achieved by interchanging the position of individual magnet segments within the carrier plate.

Figure 16:
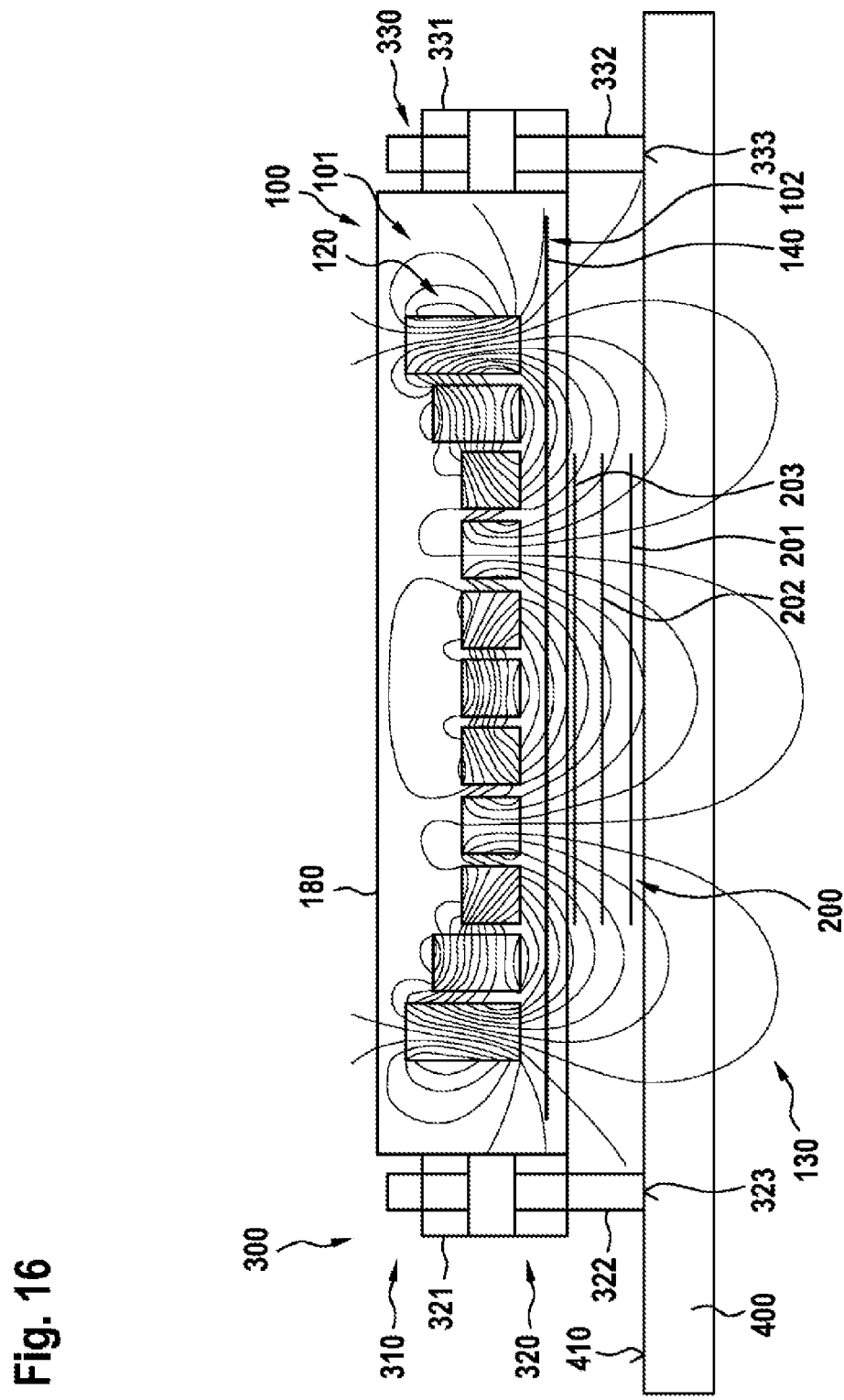
FIG. 16 shows a schematic side view of a nuclear magnetic resonance device comprising a sensor and a lifting device for setting the distance between the sensor and a material sample which is arranged in the useful volume.

FIG. 16 shows an exemplary nuclear magnetic resonance device 300 arranged on a base plate 400. The nuclear magnetic resonance device 300 herein comprises a sensor 100 which is arranged within a housing 180, a housing 180 accommodating the sensor 100, and a mechanical lifting device 310, arranged on the housing, for setting the clearance between the sensor 100 and a material sample arranged thereunder. The sensor 100, which is structured in an essentially analogous manner to the sensor from FIG. 4, herein comprises a magnetic field generation apparatus 101 having a magnet arrangement 120 for generating a static magnetic field 130 and a measuring apparatus 102 having an electrical coil 140 for generating an alternating magnetic field 150. In the present example, however, the sensor 100 is arranged so as to be rotated through 180°, such that the static magnetic field 130 generated by the magnet arrangement 120 extends downward into the base plate 400. Correspondingly, the useful volume 200 and the measuring layers 201, 202, 203 contained therein are also arranged below the sensor 100. In this arrangement, the nuclear magnetic resonance device 300 can determine specific material properties of the base plate 400 which, in the present example, serves as the material sample. In principle, however, material samples can thus also be scanned which are arranged on or below the base plate 400 or within the base plate 400.

The mechanical lifting device 310 comprises one or more manually- or electrically-operated actuators 320, 330 which preferably are arranged in a distributed manner along the outer perimeter of the housing 180. In particular, four actuators can be provided, which are respectively arranged at the corners of the housing 180. In FIG. 16, a total of two actuators 320, 330 are represented, which are arranged on two mutually opposing sides of the housing 180. In the present exemplary embodiment, the actuators 320, 330 are arranged on the outer side of the housing 180. Alternatively, however, the actuators 320, 330 can also be arranged within the housing 180 (not represented here). The actuators 320, 330 each comprise a first actuator part 321 which is connected to the housing 180, and a second actuator part 322, 332 which is respectively moveable in relation thereto and which engages with a contact surface 323, 333 on the surface 410 of the base plate 400, which serves as the material sample. In the present example, the actuators 320, 330 are configured in the form of electrical drives. The second actuator part 322, 332 respectively constitutes in this case an electric motor, whereas the first actuator part 321, 331 is configured in the form of a spindle which is driven by the electric motor. A form of construction of this type permits a particularly fine and accurate adjustment. In the operation of the actuator device 300, the first actuator part 321, 331 is displaced in relation to the respectively second actuator part 322, 332. By a coordinated movement of all the actuators, a desired lifting motion of the sensor 100 in relation to the base plate 400 is achieved. Accordingly, by means of the lifting device 300, depth-dependent measured values can be generated in a relatively simple manner, by means of which a depth profile of the base plate 400 or of a material sample which is connected to the base plate 400 in a stationary manner can be generated.

The lifting device is preferably controlled by means of an appropriate control apparatus. Said control apparatus can be, for example, an integral constituent of the control and evaluation apparatus of the nuclear magnetic resonance device. Moreover, however, an autonomously operating control device for the control of the lifting motion of the sensor 100 is also possible.

In addition to the electric motors with spindles represented here, all appropriate mechanical devices are in principle considered as actuators for the height adjustment of the sensor 100. Inter alia, manually-operated actuators can also be employed, which comprise, for example, a manual latching arrangement with predefined spacing intervals.

In the interests of clarity, further components of the nuclear magnetic resonance device 300 such as, for example the control and evaluation apparatus or the energy supply apparatus, are not shown in FIG. 16.

The nuclear magnetic resonance device can comprise one or more of the NMR sensors described herein. Moreover, a typical nuclear magnetic resonance device also comprises further components, such as for example a control and evaluation apparatus and an energy supply apparatus.

Although the disclosure has primarily been described with reference to specific exemplary embodiments, it is by no means limited to the latter. A person skilled in the art will thus appropriately be able to adjust and mutually combine the characteristics described, without departing from the core of the disclosure. In particular, the methods which are respectively separately described here for the local modification of the magnetic properties of the correction layer can also be mutually combined as required.

The invention claimed is:

1. A sensor for a nuclear magnetic resonance device for determining at least one material property of a material sample arranged in a useful volume comprising:

a magnetic field generation apparatus having a planar magnet arrangement configured to generate a static magnetic field in the useful volume, wherein the planar magnet arrangement has a plurality of magnetic poles on a front side facing the useful volume, and wherein the magnetic poles are arranged adjacently to each other along a first extension direction of the planar magnet arrangement with a respectively alternating orientation; and a measuring apparatus configured to measure a signal based on a nuclear magnetic resonance of the material sample arranged in the useful volume, the measuring apparatus including an electrical coil having at least one winding configured to generate an alternating magnetic field in the useful volume, wherein the at least one winding is arranged between two directly adjacent magnetic poles of the plurality of magnetic poles, such that the alternating magnetic field of the electrical coil is superimposed substantially orthogonally with the static magnetic field of the planar magnet arrangement in the entire useful volume, wherein the electrical coil is configured in the form of a multiresonant coil.

2. The sensor as claimed in claim 1, wherein:
the planar magnet arrangement comprises a plurality of magnet segments, which are arranged adjacently to one another and which respectively have directions of magnetization which are oriented orthogonally to a second extension direction of the planar magnet arrangement orthogonal to the first extension direction; and each magnet segment of the plurality of magnet segments which is arranged directly adjacently to another one of the plurality of magnet segments along the first extension direction of the planar magnet arrangement has a direction of magnetization which is rotated relative to the other one of the plurality of magnet segments, such that the static magnetic field is generated predominantly on the front side of the planar magnet arrangement compared to a reverse side of the planar magnet arrangement.

3. The sensor as claimed in claim 2, the magnetic field generation apparatus further comprising:
a carrier plate of a non-magnetic material, wherein the magnet segments are fitted into at least one opening in the carrier plate,
wherein at least a portion of the magnet segments of the magnet arrangement are rotatably fitted within the carrier plate.

4. The sensor as claimed in claim 3, wherein the magnetic field generation apparatus is extendable in a modular manner by the side-by-side arrangement of a plurality of carrier plates in at least one of the first extension direction and the second extension direction of the planar magnet arrangement.

5. The sensor as claimed in claim 2, wherein:
a first plurality of the magnet segments in an edge region of the planar magnet arrangement are configured to generate a portion of the static magnetic field with a higher magnetic field strength than a portion of the static magnetic field generated by a second plurality of the magnet segments in a central region of the planar magnet arrangement;
the first plurality of magnet segments have a first magnetization and a first vertical extension;
the second plurality of magnet segments in the central region of the planar magnet arrangement have a second magnetization and a second vertical extension; and
at least one of the first magnetization and the first vertical extension is greater than the second magnetization or the second vertical extension.

6. The sensor as claimed in claim 5, wherein, the first plurality of magnet segments are arranged one on top of another to achieve the portion of the static magnetic field with the higher magnetic field strength.

7. The sensor as claimed in claim 2, wherein at least a portion of the magnet segments in the planar magnet arrangement comprises a jacket made from a plastic.

8. The sensor as claimed in claim 1, wherein;
along the first extension direction of the planar magnet arrangement, each magnet segment of the plurality of magnet segments which is arranged directly adjacently to another one of the plurality of magnet segments has a direction of magnetization which is rotated 45° in relation to the other one of the plurality of magnet segments.

9. The sensor as claimed in claim 1,
wherein the electrical coil is further configured to measure a signal which is based on the nuclear magnetic resonance of the material sample which is arranged in the useful volume.

10. The sensor as claimed in claim 1, wherein the electrical coil is arranged on the front side of the planar magnet arrangement.

11. The sensor as claimed in claim 1, wherein:
the electrical coil is configured in the form of a structured electrically conductive layer; and
in the electrically conductive layer, at least one shim coil is further configured to homogenize the static magnetic field which is generated by the planar magnet arrangement in the useful volume.

12. The sensor as claimed in claim 1, wherein:
four magnetic poles having respectively alternating orientations are configured on the front side of the planar magnet arrangement; and
the electrical coil of the measuring apparatus comprises three adjacently arranged windings, each of the three adjacently arranged windings having a respective magnetic pole arranged between two directly adjacent magnetic poles of the planar magnet arrangement.

13. The sensor as claimed in claim 1, further comprising:
an inner shielding structure of an electrically conductive material having a high magnetic permeability arranged between the electrical coil and the planar magnet arrangement, the inner shielding structure configured to shield the magnet segments from the alternating magnetic field of the electrical coil.

14. The sensor as claimed in claim 1, further comprising:
an outer shielding structure of an electrically conductive material having a high magnetic permeability arranged between the electrical coil and the useful volume, the outer shielding structure configured to shield the electrical coil from electromagnetic interference fields, and including
a plurality of resonance structures, the plurality of resonance structures configured to shield, in a targeted manner, electromagnetic interference fields with frequencies in a region of a network frequency.

15. A nuclear magnetic resonance device comprising a sensor as claimed in claim 1, wherein the nuclear magnetic resonance device is configured to determine at least one material property of the material sample for each of a plurality of measuring layers in the useful volume.

16. The nuclear magnetic resonance device as claimed in claim 15, wherein the nuclear magnetic resonance device comprises;
a lifting device having at least one electrically- and/or manually-driven actuator configured to set a distance between the sensor and the material sample.

17. The nuclear magnetic resonance device as claimed in claim 16, wherein the actuator comprises:
   a first actuator part configured to carry the sensor; and
   a second actuator part moveable with respect to the sensor and having a contact surface configured to engage a surface which is arranged in a stationary manner in relation to the material sample.

18. The nuclear magnetic resonance device as claimed in claim 17, wherein:
   the first actuator part is configured in the form of an electric motor; and
   the second actuator part is configured in the form of a spindle which is driven by the electric motor.

19. The nuclear magnetic resonance device as claimed in claim 17, wherein the lifting device comprises:
   a plurality of actuators arranged in a distributed manner along a perimeter of the sensor.

20. A sensor for a nuclear magnetic resonance device for determining at least one material property of a material sample arranged in a useful volume comprising:
   a magnetic field generation apparatus having a planar magnet arrangement configured to generate a static magnetic field in the useful volume, wherein the planar magnet arrangement has a plurality of magnetic poles on a front side facing the useful volume, and wherein the magnetic poles are arranged adjacently to each other along a first extension direction of the planar magnet arrangement with a respectively alternating orientation;
   a measuring apparatus configured to measure a signal based on a nuclear magnetic resonance of the material sample arranged in the useful volume, the measuring apparatus including an electrical coil having at least one winding configured to generate an alternating magnetic field in the useful volume, wherein the at least one winding is arranged between two directly adjacent magnetic poles of the plurality of magnetic poles, such that the alternating magnetic field of the electrical coil is superimposed substantially orthogonally with the static magnetic field of the planar magnet arrangement in the entire useful volume; and
   an inner shielding structure of an electrically conductive material having a high magnetic permeability arranged between the electrical coil and the planar magnet arrangement, the inner shielding structure configured to shield the magnet segments from the alternating magnetic field of the electrical coil.

21. A sensor for a nuclear magnetic resonance device for determining at least one material property of a material sample arranged in a useful volume comprising:
   a magnetic field generation apparatus having a planar magnet arrangement configured to generate a static magnetic field in the useful volume, wherein the planar magnet arrangement has a plurality of magnetic poles on a front side facing the useful volume, and wherein the magnetic poles are arranged adjacently to each other along a first extension direction of the planar magnet arrangement with a respectively alternating orientation;
   a measuring apparatus configured to measure a signal based on a nuclear magnetic resonance of the material sample arranged in the useful volume, the measuring apparatus including an electrical coil having at least one winding configured to generate an alternating magnetic field in the useful volume, wherein the at least one winding is arranged between two directly adjacent magnetic poles of the plurality of magnetic poles, such that the alternating magnetic field of the electrical coil is superimposed substantially orthogonally with the static magnetic field of the planar magnet arrangement in the entire useful volume; and
   an outer shielding structure of an electrically conductive material having a high magnetic permeability arranged between the electrical coil and the useful volume, the outer shielding structure configured to shield the electrical coil from electromagnetic interference fields, and including
      a plurality of resonance structures, the plurality of resonance structures configured to shield, in a targeted manner, electromagnetic interference fields with frequencies in a region of a network frequency.

* * * * *